(12) United States Patent
Muramatsu et al.

(10) Patent No.: US 10,998,528 B2
(45) Date of Patent: May 4, 2021

(54) ORGANIC EL IMAGE DISPLAY DEVICE

(71) Applicant: FUJIFILM Corporation, Tokyo (JP)

(72) Inventors: Ayako Muramatsu, Kanagawa (JP);
Daisuke Kashiwagi, Kanagawa (JP);
Shinichi Yoshinari, Kanagawa (JP);
Ryoji Goto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/583,963

(22) Filed: Sep. 26, 2019

(65) Prior Publication Data
US 2020/0020889 A1 Jan. 16, 2020

Related U.S. Application Data

(63) Continuation of application No. PCT/JP2018/013070, filed on Mar. 29, 2018.

(30) Foreign Application Priority Data

Mar. 30, 2017 (JP) .............................. JP2017-068201

(51) Int. Cl.
*H01L 51/52* (2006.01)
*H01L 27/32* (2006.01)

(52) U.S. Cl.
CPC ...... *H01L 51/5284* (2013.01); *H01L 51/5271* (2013.01); *H01L 27/3211* (2013.01)

(58) Field of Classification Search
CPC . H01L 51/5284; H01L 27/32; H01L 51/5271; H01L 27/3211; G09F 9/30; G02B 5/3025; G02F 2001/133541
See application file for complete search history.

(56) References Cited

U.S. PATENT DOCUMENTS

2002/0093284 A1 7/2002 Adachi et al.
2004/0051445 A1 3/2004 Adachi
(Continued)

FOREIGN PATENT DOCUMENTS

JP 2004-030955 A 1/2004
JP 2004-296162 A 10/2004
(Continued)

OTHER PUBLICATIONS

International Search Report issued in PCT/JP2018/013070 dated Jun. 19, 2018.
(Continued)

*Primary Examiner* — Changhyun Yi
(74) *Attorney, Agent, or Firm* — Edwards Neils LLC; Jean C. Edwards, Esq.

(57) ABSTRACT

An organic EL image display device that includes a light emitting element substrate; and a circularly polarizing plate. The light emitting element substrate includes a reflecting layer and an organic electroluminescent layer group arranged in a matrix form on the reflecting layer. The reflecting layer, the organic electroluminescent layer group, and the circularly polarizing plate are arranged in this order. A polarization separation layer is provided between the organic electroluminescent layer group and the circularly polarizing plate, and includes polarization separation sites arranged in a matrix form corresponding to the organic electroluminescent layer group. The polarization separation site reflects light of one polarization state and transmits light of the other polarization state in light emitted from the corresponding organic electroluminescent layer. The polarization separation site is divided by a visible light transmission region. The organic EL image display device of the present invention has high brightness and little blurring.

8 Claims, 8 Drawing Sheets

(56) References Cited

U.S. PATENT DOCUMENTS

| | | | |
|---|---|---|---|
| 2014/0042409 A1* | 2/2014 | Ohyama | ............ H01L 51/5262 257/40 |
| 2015/0042942 A1 | 2/2015 | Hatanaka et al. | |
| 2015/0131031 A1 | 5/2015 | Kim et al. | |

FOREIGN PATENT DOCUMENTS

| | | |
|---|---|---|
| JP | 4011292 B2 | 11/2007 |
| JP | 2009-283246 A | 12/2009 |
| JP | 2013-206596 A | 10/2013 |
| JP | 2014-038713 A | 2/2014 |
| JP | 2015-163940 A | 9/2015 |

OTHER PUBLICATIONS

Written Opinion issued in PCT/JP2018/013070 dated Jun. 19, 2018.
International Preliminary Report on Patentability issued by WIPO dated Oct. 1, 2019, in connection with International Patent Application No. PCT/JP2018/013070.
Office Action, issued by the Japanese Patent Office dated Apr. 21, 2020, in connection with Japanese Patent Application No. 2019-510081.

* cited by examiner

10 μm f = 10.7 μm
g = 11.8 μm
h = 6.4 μm f = 10.7 μm
g = 11.8 μm
h = 6.4 μm

ORGANIC EL IMAGE DISPLAY DEVICE

CROSS-REFERENCE TO RELATED APPLICATIONS

This application is a continuation of PCT International Application No. PCT/JP2018/013070 filed on Mar. 29, 2018, which was published under PCT Article 21(2) in Japanese, and which claims priority under 35 U.S.C § 119 (a) to Japanese Patent Application No. 2017-068201 filed on Mar. 30, 2017, the entire content of all of which are incorporated herein by reference in their entirety.

BACKGROUND OF THE INVENTION

1. Field of the Invention

The present invention relates to an organic EL image display device.

2. Description of the Related Art

In an organic electroluminescent image display device (organic EL image display device, hereinafter, simply referred to as "image display device") that forms an image based on the light emitted from an organic electroluminescent layer, generally, a circularly polarizing plate constituted of a phase difference layer and a polarization layer is arranged in order to reduce the reflected glare of external light and to improve the contrast. However, in this configuration, a half or more of the light emitted from the organic electroluminescent layer is absorbed by the circularly polarizing plate.

In consideration of the above problem, JP4011292B proposes to provide polarization separation means between an organic electroluminescent layer and a circularly polarizing plate. The polarization separation means transmits the light passing through the circularly polarizing plate, reflects the polarized light absorbed by the circularly polarizing plate, and enhances the light utilization efficiency based on specular reflection at a reflecting layer in a light emitting element substrate so as to improve the brightness. Further, JP4011292B specifically discloses the polarization separation means obtained by forming a cholesteric liquid crystal layer having wavelength selective reflectivity corresponding to the light emission wavelength of the corresponding organic electroluminescent layer in each region divided by a black matrix corresponding to the arrangement of the organic electroluminescent layers.

Similarly, in JP2009-283246A, an organic EL image display device in which a cholesteric liquid crystal layer is provided between an organic electroluminescent layer and a circularly polarizing plate is disclosed. In JP2009-283246A, a laminate in which a light shielding layer and a colored layer are further laminated on a circular polarization separation layer obtained by laminating cholesteric liquid crystal layers having selective reflection for blue, green, and red is provided between the organic electroluminescent layer and the circularly polarizing plate.

SUMMARY OF THE INVENTION

In addition, in any of the organic EL image display devices described in JP4011292B and JP2009-283246A, a visible light blocking layer for providing a section corresponding to the organic electroluminescent layer is provided between the organic electroluminescent layer and the circularly polarizing plate. Since the amount of light to be transmitted from the organic electroluminescent layer to the circularly polarizing plate is reduced by the visible light blocking layer, the brightness of the organic EL image display device is reduced. On the other hand, in a case where the cholesteric liquid crystal layer is arranged without providing a light shielding layer, there is a problem that blurring in an image may be observed.

The present invention is made to solve the above problems and an object thereof is to provide an organic EL image display device with high brightness and little image blurring.

The present inventors considered that the blurring occurs based on light which travels from the inside of an organic electroluminescent layer diagonally to a circularly polarizing plate direction and carried out intensive studies in order to solve the above problems. As a result, the present inventors found that a region corresponding a region between organic electroluminescent layers is allowed to have the visible light transmittance to reduce the blurring, and the present invention has been achieved on the basis of the knowledge.

That is, the present invention is to provide the following [1] to [7].

[1] An organic EL image display device comprising: a light emitting element substrate; and a circularly polarizing plate, in which the light emitting element substrate includes a reflecting layer and an organic electroluminescent layer group arranged in a matrix form on the reflecting layer, the reflecting layer, the organic electroluminescent layer group, and the circularly polarizing plate are arranged in this order, a polarization separation layer is provided between the organic electroluminescent layer group and the circularly polarizing plate, the polarization separation layer includes polarization separation sites arranged in a matrix form corresponding to the organic electroluminescent layer group, the polarization separation site reflects light of one polarization state and transmits light of the other polarization state in light emitted from the corresponding organic electroluminescent layer, and the polarization separation layer is divided by a visible light transmission region to form the polarization separation sites.

[2] The organic EL image display device according to [1], in which the polarization separation site includes a layer formed by immobilizing a cholesteric liquid crystalline phase.

[3] The organic EL image display device according to [2], in which the visible light transmission region includes a layer obtained by curing the same composition as a composition for the polarization separation site, and the visible light transmission region is optically isotropic.

[4] The organic EL image display device according to [2], in which the visible light transmission region includes a layer obtained by curing the same composition as a composition for the polarization separation site, and the visible light transmission region has a central wavelength of selective reflection in an ultraviolet light wavelength region or an infrared light wavelength region.

[5] The organic EL image display device according to [2], in which the visible light transmission region does not include a layer obtained by curing the same composition as a composition for the polarization separation site.

[6] The organic EL image display device according to any one of [1] to [5], in which in an optional plane Z which passes through the polarization separation site at optional coordinates xy of the matrix and is perpendicular to the reflecting layer, Expression (1) is satisfied.

$$L \leq (M+N)/2 \quad (1)$$

L: Length of intersection between polarization separation site at coordinates xy and plane Z M: Length of intersection between organic electroluminescent layer at coordinates xy corresponding to polarization separation site at coordinates xy and plane Z N: Distance from center of intersection between organic electroluminescent layer at coordinates xy and plane Z to center of intersection between closest organic electroluminescent layer emitting light of same wavelength as organic electroluminescent layer at coordinates xy and has intersection point at plane Z and plane Z

[7] The organic EL image display device according to any one of [1] to [6], in which in the polarization separation site at optional coordinates xy in the matrix, Expression (2) is satisfied.

$$L \geq 1.25 \times D + M \quad (2)$$

D: Distance between polarization separation site at coordinates xy and organic electroluminescent layer at coordinates xy According to the present invention, it is possible to provide an organic EL image display device with high brightness and little blurring.

DESCRIPTION OF THE PREFERRED EMBODIMENTS

Figure 1A:
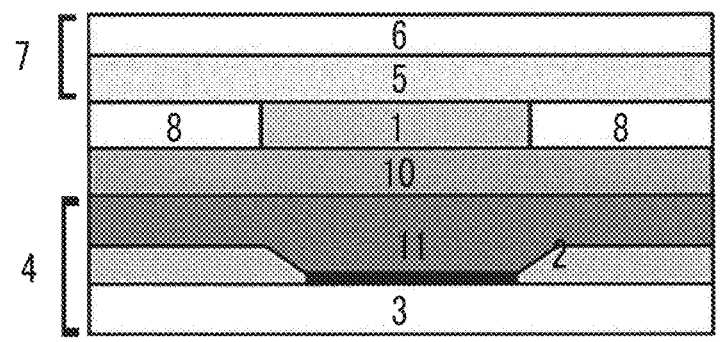
FIGS. 1A to 1C are schematic cross-sectional views of examples of an image display device according to the present invention.

Hereinafter, the present invention will be described in detail.

In the present specification, a numerical range denoted by using "to" indicates a range including numerical values before and after "to" as the lower limit and the upper limit.

In the present specification, numerical values, numerical ranges, and qualitative expressions (for example, expressions such as "equivalent" and "equal" are interpreted to be numerical values, numerical ranges, and properties including error which is generally allowable in a liquid crystal display device and the members used therein.

In the present specification, for example, an angle expressed as "45°", "parallel", "perpendicular" or "orthogonal" means that an error with respect to the exact angle is in a range of less than 5° unless otherwise specified. The error with respect to the exact angle is preferably less than 4° and more preferably less than 3°.

In the present specification, the term "(meth)acrylate" is used as a meaning of "any one or both of acrylate and methacrylate.

In the present specification, the term "sense" used in regard to circularly polarized light means right-handed circularly polarized light or left-handed circularly polarized light. The sense of circularly polarized light is defined such that, in a case where light is viewed as the light proceeds toward an observer and in a case where the tip of the electric field vector rotates clockwise with the increase in time, the sense is right-handed circularly polarized light, and in a case where the tip of the electric field vector rotates counterclockwise, the light is left-handed circularly polarized light.

In the present specification, the term "sense" may be used in regard to a twisted direction of the helix of a cholesteric liquid crystal. In a case where the twisted direction (sense) of the helix of the cholesteric liquid crystal is right, right-handed circularly polarized light is reflected and in a case where left-handed circularly polarized light is transmitted and the sense is left-handed, left-handed circularly polarized light is reflected and right-handed circularly polarized light is transmitted.

Visible light is light having wavelengths visually recognizable by human eyes among electromagnetic waves and indicates light in a wavelength range of 380 nm to 780 nm.

In the present specification, the visible light transmittance may be measured according to JIS A 5759: 2008. The measurement of the visible light transmittance can be performed by using, for example, an ultraviolet-visible near-infrared spectrometer (V-670, manufactured by JASCO Corporation, using integrating sphere unit ISN-723).

In addition, in the present specification, the visible light reflectivity means a numerical value calculated based on a calculation method described in JIS A5759. That is, the light reflectivity is obtained by measuring the reflectivity at a wavelength of 380 nm to 780 nm is measured with a spectrophotometer, and multiplying the measured reflectivity by a weighting factor to obtain a weighted average, the weighting factor being obtained based on a spectral distribution of daylight D65 defined by The International Commission on Illumination (CIE), and a wavelength distribution and a wavelength interval of spectral luminous efficiency function for photopic vision defined by CIE.

In a case where the visible light reflectivity is obtained, for example, a spectrophotometer "V-670" manufactured by JASCO Corporation can be used.

<Organic EL Image Display Device>

An image display device according to an embodiment of the present invention is an organic EL image display device that performs image display based on light emitted from an organic electroluminescent layer. An organic EL image display device is a self-emitting display device, and has such advantages in display performances as higher visibility and less viewing angle dependency as compared with a cathode ray tube (CRT) type display device or liquid crystal display device.

An organic EL image display device displays images by a light emitting element substrate on which an organic electroluminescent layer group is provided. In addition, an organic EL image display device generally includes a circularly polarizing plate on an image display side of an organic electroluminescent layer group in order to reduce the reflected glare of external light and improve the contrast. The image display device according to the embodiment of the present invention includes a polarization separation layer between the light emitting element substrate and the circularly polarizing plate. In the image display device according to the embodiment of the present invention, a reflecting layer, an organic electroluminescent layer group, a polarization separation layer, and a circularly polarizing plate are arranged in this order.

In the polarization separation layer in the image display device according to the embodiment of the present invention, a plurality of polarization separation sites corresponding to a plurality of organic light emitting layers of the organic electroluminescent layer group are included. In the present specification, the "correspond" means that when the image display device is viewed from the image display side, the organic electroluminescent layer and the polarization separation site are at the same position or in a position where the organic electroluminescent layer and the polarization separation site are at least partially overlapped with each other. In the corresponding organic electroluminescent layer and polarization separation site, the light emitted from the organic electroluminescent layer (preferably 50% or more, more preferably 60% or more, and even more preferably 70% or more) may be reflected or transmitted through the polarization separation site.

When the image display device is viewed from the image display side, the corresponding organic electroluminescent layer and polarization separation site may have the same size, the size of the organic electroluminescent layer may be large, or the size of the polarization separation site may be large. Among these, it is preferable that the size of the polarization separation site is large. It is preferable that the image display device according to the embodiment of the present invention is such that the organic electroluminescent layer is covered by the corresponding polarization separation portion when viewed from the image display side.

In the organic electroluminescent layer group, the plurality of organic electroluminescent layers may be included in the form of a matrix on the reflecting layer.

In a monochromatic image display device, any of organic electroluminescent layers included in the organic electroluminescent layer group may emit light of the same wavelength. On the other hand, usually, the organic electroluminescent layer group preferably includes organic electroluminescent layers that emit light of different wavelengths, and more preferably includes two or more organic electroluminescent layers, particularly three or more organic electroluminescent layers. The organic electroluminescent layer group preferably includes an organic electroluminescent layer for red light emission, an organic electroluminescent layer for green light emission, and an organic electroluminescent layer for blue light emission.

[Polarization Separation Layer, Polarization Separation Site, and Polarization Separation Region]

The polarization separation layer is a layer including the polarization separation sites. When the image display device according to the embodiment of the present invention is viewed from the image display side, the polarization separation layer is arranged in the form of a matrix in the polarization separation layer. In the present specification, a region formed by the plurality of polarization separation sites is referred to as a polarization separation region. In the image display device according to the embodiment of the present invention, the polarization separation layer includes a region other than the polarization separation region. The region other than the polarization separation region may be a visible light transmission region.

In the present specification, polarization separation site refers to a site for performing polarization separation in the wavelength range of the light emitted from the corresponding organic electroluminescent layer. The polarization separation refers to the reflection of light in one polarization state and the transmission of light in the other polarization state. In the image display device according to the embodiment of the present invention, the polarization separation may be performed by reflecting circularly polarized light of one sense and transmitting circularly polarized light of the other sense.

The polarization separation site may be a site where selective polarization separation can be performed in a wavelength range of light of the corresponding organic electroluminescent layer or a site where polarization separation can be performed in a wavelength range other than the wavelength range.

The term "selective polarization separation" refers to polarization separation only in the wavelength range corresponding to the wavelength range of the light emitted from the organic electroluminescent layer corresponding to the polarization separation site in the visible light region. Accordingly, the polarization separation site may be a site where polarization separation is performed only in the wavelength range corresponding to the wavelength range of the light emitted from the organic electroluminescent layer corresponding to the polarization separation site in the visible light region, may be a site where polarization separation is performed in the substantially entire wavelength range of visible light, or may be a site where polarization separation is performed in a plurality of wavelength ranges such as a red wavelength range, a green wavelength range, and a blue wavelength range.

It is preferable that the polarization separation site is a site capable of selectively performing polarization splitting in the wavelength range of the light emitted from the corresponding organic electroluminescent layer.

In the image display device according to the embodiment of the present invention, the polarization separation site is arranged such that in the light emitted from the organic electroluminescent layer, the polarized light which is not transmitted through the circularly polarizing plate is reflected at the polarization separation site and is directed toward the reflecting layer.

The polarization separation layer of the image display device according to the embodiment of the present invention is divided into visible light transmission regions to form polarization separation sites. It is possible to improve the brightness by increasing the amount of light reaching the image display side from the organic electroluminescent layer by dividing the polarized light separation site using the visible light transmission region instead of using a visible light shielding layer or the like. It is also possible to reduce the blurring of an image derived from the light traveling obliquely in the direction of the circularly polarizing plate from the inside of the organic electroluminescent layer by separating the polarization separation layer by the visible light transmission region without continuously providing the polarization separation site. It is considered that an image is blurred as a result of the multiple reflection of a depolarized component in a process that the light directed toward the circularly polarizing plate from the inside of the organic electroluminescent layer is reflected at the polarization separation site and the reflected light is reflected at the reflecting layer and emitted to the image display side. Since the light directed obliquely toward the direction of the circularly polarizing plate from the inside of the organic electroluminescent layer is transmitted as it is and is emitted to the image display side by dividing the polarization separation layer using the visible light transmission region, it is possible to reduce blurring (such as color blurring when observed in the oblique direction during white display of the image display device).

The visible light transmittance in the visible light transmission region may be 80% to 100% and is preferably 90% to 100%. It is preferable that the visible light transmission region is non-light-reflective at least at the surface on the organic electroluminescent layer side. Particularly, it is preferable that the organic electroluminescent layer group is non-light-reflective in each light emission wavelength range. It is also preferable that the organic electroluminescent layer group is non-light-reflective throughout the entire visible light wavelength range. It is preferable that the visible light reflectivity of the surface of the visible light transmission region on the organic electroluminescent layer side is 0% to 5%, and preferably 0% to 2%.

The visible light transmission region may be, for example, an optically isotropic region, a region having a central wavelength of selective reflection in an ultraviolet light wavelength region or an infrared light wavelength region. All of these regions can be prepared using the same composition as the composition for the polarization separation site, for example, as described below. The visible light transmission region is a region after removal of a coating film or a cured film formed in the preparation of the above-mentioned polarization separation site and may be a region which is an adhesive for bonding with the light emitting element substrate.

Figure 1B:
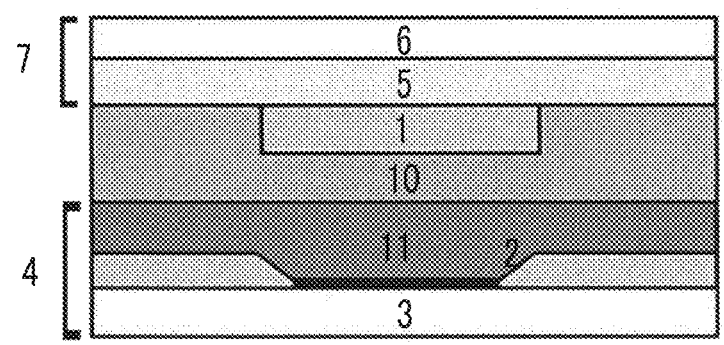
Figure 1C:
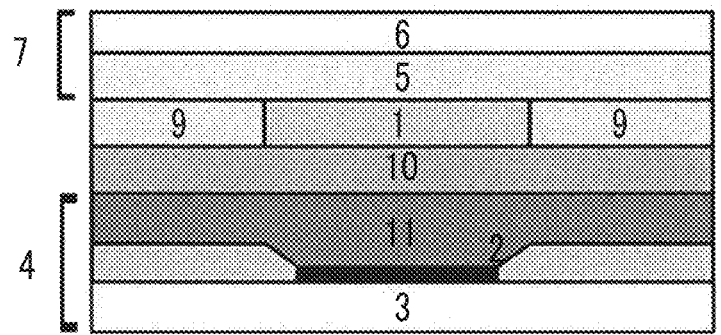

Schematic cross-sectional views of examples of the image display device according to the embodiment of the present invention are shown in FIGS. 1A to 1C.

FIGS. 1A to 1C show configurations in which a reflecting layer 3, an organic electroluminescent layer 2, a polarization separating site 1, and a circularly polarizing plate 7 are provided in this order. In the configuration shown in FIG. 1A, an optically isotropic visible light transmission region 8 formed of the same composition as the composition for the polarization separation site is provided. In the configuration shown in FIG. 1B, a visible light transmission region is formed of an adhesive layer 10. In the configuration shown in FIG. 1C, the visible light transmission region is constituted as a region 9 having a center wavelength of selective reflection in the ultraviolet light wavelength region.

In the image display device of the embodiment of the present invention, it is preferable that in an optional plane Z which passes through the polarization separation site at optional coordinates xy of the matrix of the polarization separation layer and is perpendicular to the reflecting layer, Expression (1) is satisfied. The polarization separation site is formed with divisions in the visible light transmission region so as to satisfy Expression (1), so that the blurring derived from the multiple reflection and the depolarization as described above can be reduced.

$$L \leq (M+N)/2 \quad (1)$$

Figure 2:
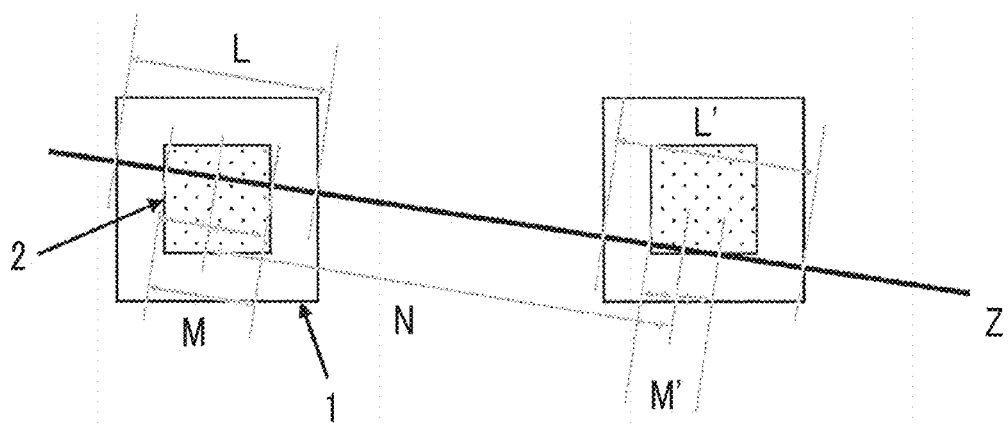
FIG. 2 is a view showing L, M, and N in Expressions (1) and (2) in a plan view of a polarization separation layer viewed from the image display side in the normal direction.

L: Length of intersection between polarization separation site at coordinates xy and plane Z M: Length of intersection between organic electroluminescent layer at coordinates xy corresponding to polarization separation site at coordinates xy and plane Z N: Distance from center of intersection between organic electroluminescent layer at coordinates xy and plane Z to center of intersection between closest organic electroluminescent layer emitting light of same wavelength as organic electroluminescent layer at coordinates xy and has intersection point at plane Z and plane Z L, M and N may be determined with respect to a plan view of the polarization separation layer viewed from the image display side in the normal direction of the light emitting element substrate of the image display device of the present invention, or for example, can be defined as shown in FIG. 2.

In the image display device of the embodiment of the present invention, it is preferable that Expression (2) is satisfied in the polarization separation site at optional coordinates xy. The polarization separation site is formed with divisions in the visible light transmission region so as to satisfy Expression (2), so that the polarization separation site has a size corresponding to the distance between the polarization separation site and the organic electroluminescent layer. Therefore the light utilization efficiency is enhanced so as to improve the brightness.

$$L \geq 1.25 \times D + M \quad (2)$$

D: Distance between polarization separation site at coordinates xy and organic electroluminescent layer at coordinates xy In the image display device according to the embodiment of the present invention, the wavelength range of the reflection (the reflection in the wavelength range of light emitted from the corresponding organic electroluminescent layer) at the polarization separation site is preferably wider than the wavelength range of the light emitted from the organic electroluminescent layer. In the image display devices including organic electroluminescent layers with different light emission wavelengths for the organic electroluminescent layer group, the half-value of the light emission spectrum of each organic electroluminescent layer may be different, but the above relationship may be satisfied in the corresponding organic electroluminescent layer and the polarization separation site.

In an organic EL image display device in which the reflection wavelength range of a polarization separation site is wider than that of an organic electroluminescent layer, the brightness is improved not only in the front but also in the oblique direction.

As described later, for example, when a cholesteric liquid crystal layer is used in the polarization separation site, for the light incident from the oblique direction, the reflection wavelength of the polarization separation site is shifted to a short wavelength side. Therefore, the polarization separation site that reflects the light incident from the organic electroluminescent layer in a normal direction may not reflect the light from the oblique direction. It is considered that the effect of improving the brightness in the oblique direction is obtained by the reflection of light that cannot be reflected by widening the wavelength range of the reflection at the polarization separation site.

The wavelength range of the reflection at the polarization separation site means the half-width (full half-width) of the transmission spectrum of the polarization separation site. In addition, the wavelength range of the light emitted from the organic electroluminescent layer means the half-width of the light emission spectrum of the organic electroluminescent layer.

The half-width of the light emission spectrum of a known organic electroluminescent layer is usually 40 to 55 nm, and the half-width of the transmission spectrum of the polarization separation site is properly set to a broader range than the above half-width range. Generally, the half-width is preferably 70 to 130 nm, more preferably 80 to 120 nm, and most preferably 90 to 110 nm. The above effect can be obtained by setting the reflection range to 70 nm or more, and an increase in the reflectivity from an image plane at the time of the extinction derived from the polarization separation site can be suppressed by setting the reflection range to 130 nm or less.

The plurality of polarization separation sites in the polarization separation layer may be arranged in the form of a matrix corresponding to the organic electroluminescent layer group. The polarization separation layer may be formed of a plurality of, preferably three, polarization separation sites that reflect light in one polarization state and transmits light in the other polarization state at different wavelengths. The reflection wavelengths of the plurality of polarization separation sites correspond to the light emission wavelengths of the organic electroluminescent layers included in the organic electroluminescent layer group.

Each of the polarization separation site and the polarization separation layer may be a single layer or may be formed of a plurality of layers. It is preferable that the polarization separation site and the polarization separation layer include a cholesteric liquid crystal layer. The polarization separation site and the polarization separation layer may include an alignment layer, a protective layer (additive layer), and the like in addition to the cholesteric liquid crystal layer. The polarization separation site and the polarization separation layer may include an optically isotropic layer formed by curing a composition used for forming the cholesteric liquid crystal layer in a state in which the liquid crystal compound is not aligned.

The polarization separation site is not particularly limited as long as the above properties that the organic electroluminescent layer reflects light of one polarization state and transmits the light of the other polarization state in the light emitted from the organic electroluminescent layer are attained, but is preferably a site including a cholesteric liquid crystal layer.

The polarization separation site including a cholesteric liquid crystal layer may be formed of only the cholesteric liquid crystal layer and may include other layers such as an alignment layer and a protective layer (additive layer).

(Cholesteric Liquid Crystal Layer)

In the present specification, the cholesteric liquid crystal layer means a layer in which a cholesteric liquid crystalline phase is immobilized.

It is known that the cholesteric liquid crystalline phase selectively reflects circularly polarized light of one sense of right-handed circularly polarized light or left-handed circularly polarized light in a specific wavelength range and exhibits circular polarization selective reflection that the cholesteric liquid crystalline phase transmits circularly polarized light of the other sense. In the present specification, the circular polarization selective reflection is sometimes referred to as selective reflection.

As a film including a layer formed by immobilizing a cholesteric liquid crystalline phase exhibiting circular polarization selective reflection properties, a number of films formed of a composition including a polymerizable liquid crystal compound have been known in the related art and regarding the cholesteric liquid crystal layer, the related arts thereof can be referred to.

The cholesteric liquid crystal layer may be a layer in which alignment of a liquid crystal compound formed of a cholesteric liquid crystalline phase is retained, and typically may be a layer in which the polymerizable liquid crystal compound is set to be in an alignment state of the cholesteric liquid crystalline phase and then is subjected to ultraviolet ray irradiation, heating, or the like for polymerization and curing, and thus, a layer which does not have fluidity is formed and is simultaneously changed to a state in which a change does not occur in an alignment mode due to an external field or an external force. Further, in the cholesteric liquid crystal layer, it is sufficient that the optical properties of the cholesteric liquid crystalline phase are retained in the layer, and the liquid crystal compound in the layer may no longer exhibit liquid crystal properties. For example, the polymerizable liquid crystal compound may have a high molecular weight by a curing reaction, and may no longer have liquid crystal properties.

A center wavelength l of the selective reflection of the cholesteric liquid crystal layer depends on a pitch length P (=a helical cycle) of the helical structure in a cholesteric liquid crystalline phase, and follows a relationship of $\lambda = n \times P$ with an average refractive index n of the cholesteric liquid crystal layer. In the present specification, the center wavelength l of the selective reflection of the cholesteric liquid crystal layer means a wavelength in a center position of a reflection peak of a circular polarization reflection spectrum measured from the normal direction of the cholesteric liquid crystal layer. In addition, in the present specification, the center wavelength of the selective reflection means the center wavelength of the cholesteric liquid crystal layer when measured from the normal direction of the cholesteric liquid crystal layer.

The center wavelength of the selective reflection and the half-width of the cholesteric liquid crystal layer can be obtained as follows.

In a case where the transmission spectrum of the cholesteric liquid crystal layer (measured from the normal direction of the cholesteric liquid crystal layer) is measured using a spectrophotometer UV 3150 (manufactured by Shimadzu Corporation), a drop peak of the transmittance peak is observed in the selective reflection range. Out of two wavelengths of the intermediate (average) transmittances between the minimum transmittance of the peak and the transmittance before a drop, in a case where a wavelength value on a short wavelength side is $\lambda_l$ (nm) and a wavelength value on a long wavelength side is $\lambda_h$ (nm), the center wavelength $\lambda$ and the half-width $\Delta\lambda$ of the selective reflection can be expressed by the following equation.

$$\lambda = (\lambda_l + \lambda_h)/2$$

$$\Delta\lambda = (\lambda_h - \lambda_l)$$

The center wavelength of the selective reflection obtained as described above substantially coincides with the wavelength at the center position of the reflection peak of the circular polarization reflection spectrum of the cholesteric liquid crystal layer measured from the normal direction.

As seen from the equation $\lambda = n \times P$, it is possible to adjust the center wavelength of the selective reflection by adjusting the pitch length of the helical structure. The center wavelength l can be adjusted by adjusting the n value and the P value so as to selectively reflect any one of the right-handed circularly polarized light and the left-handed circularly polarized light at the wavelength of the selective reflection required to reflect the light incident from the corresponding organic electroluminescent layer (for example, light incident in the normal direction) in the cholesteric liquid crystal layer used for the polarization separation site.

That is, in the image display device according to the embodiment of the present invention, the peak (maximum value) of the light emission spectrum of the organic electroluminescent layer to be used may be adjusted so as to substantially coincide with the center wavelength of the selected reflection of the cholesteric liquid crystal layer of the corresponding polarization separation site. By combining the center wavelength of the selective reflection and the wavelength of the light emission peak of the organic electroluminescent layer for image display of the image display device, in the light emitted from the organic electroluminescent layer, the light of one polarization state can be reflected and the light of the other polarization state can be transmitted.

For the light obliquely incident on the cholesteric liquid crystal layer, the center wavelength of the selective reflection is shifted to the short wavelength side. In a case where the center wavelength of the selective reflection when a light beam with respect to the normal direction of the cholesteric liquid crystal layer (the helical axis direction of the cholesteric liquid crystal layer) is transmitted through the cholesteric liquid crystal layer having a refractive index $n_2$ at an angle $\theta_2$ is $\lambda_d$, $\lambda_d$ is expressed by the following equation.

$$\lambda_d = n_2 \times P \times \cos \theta_2$$

The average refractive index n of the cholesteric liquid crystal layer can be adjusted by, for example, the kind of polymerizable liquid crystal compound.

Since the pitch (P value) of the cholesteric crystalline phase depends on the kind of chelating agent used in combination with a polymerizable liquid crystal compound or the addition concentration thereof, the desired pitch can be obtained by adjusting the kind of chelating agent and the addition concentration thereof. Further, methods disclosed in "Introduction to Liquid Crystal Chemical Test", Page 46, edited by Japan Liquid Crystal Society, published by Sigma Publications, 2007, and "Liquid Crystal Handbook", Page 196, Liquid Crystal Handbook Editing Committee Maruzen are able to be used as a measurement method of the sense or the pitch of the helix.

In the image display device according to the embodiment of the present invention, as the polarization separation site, a cholesteric liquid crystal layer having a selective reflection center wavelength corresponding to the light emission wavelength of each organic electroluminescent layer in the organic electroluminescent layer group may be used. For example, when the organic electroluminescent layer group includes an organic electroluminescent layer for red light emission, an organic electroluminescent layer for green light emission, and an organic electroluminescent layer for blue light emission, the organic electroluminescent layer group may include a cholesteric liquid crystal layer having a center wavelength of selective reflection in a red light wavelength range (for example, 580 nm to 700 nm), a cholesteric liquid crystal layer having a center wavelength of selective reflection in a green light wavelength range (for example, 500 nm to 580 nm), and a cholesteric liquid crystal layer having a center wavelength of selective reflection in a blue light wavelength range (for example, 400 nm to 500 nm) in the arrangement corresponding to each layer.

In addition, in the image display device according to the embodiment of the present invention, as the visible light transmission region of the polarization separation layer, a cholesteric liquid crystal layer having a center wavelength of selective reflection in an ultraviolet light wavelength range (for example, 10 to 380 nm) or a cholesteric liquid crystal layer having a center wavelength of selective reflection in an infrared light wavelength region (for example, 780 nm to 2500 nm) may be used.

As each cholesteric liquid crystal layer, a cholesteric liquid crystal layer in which the sense of the helix is right-handed or left-handed corresponding to the sense of the circularly polarized light transmitted through the circularly polarizing plate of the image display device according to the embodiment of the present invention is used. Specifically, a cholesteric liquid crystalline phase circularly which transmits circularly polarized light of the same sense as the sense of the circularly polarized light transmitted through the polarizing plate is used.

The sense of the reflection circular polarization of the cholesteric liquid crystal layer coincides with the sense of the helix. When the polarization separation layer includes a plurality of cholesteric liquid crystal layers, the senses of the helices of these layers are usually the same.

As described above, the wavelength range of the reflection of the polarization separation site is wider than the wavelength range of the corresponding organic electroluminescent layer. This may be achieved by the fact that the half-width of the selective reflection of the cholesteric liquid crystal layer included in the polarization separation site is wider than the half-width of the light emission spectrum of the organic electroluminescent layer.

The half-width $\Delta \lambda$ (nm) of the selective reflection of the cholesteric liquid crystal layer depends on the birefringence $\Delta n$ of the liquid crystal compound and the pitch P and follows a relationship of $\Delta \lambda = \Delta n \times P$. Therefore, the half-width of the selective reflection can be controlled by adjusting $\Delta n$. The adjustment of $\Delta n$ can be performed by adjusting the kind of polymerizable liquid crystal compound, the mixing ratio thereof, or by controlling the temperature during alignment immobilization. In order to form a polarization separation site that exhibits reflection in a wavelength range that is wider than the light emission wavelength range of the corresponding organic electroluminescent layer, in the image display device according to the embodiment of the present invention, it is also preferable to use a combination of a polymerizable liquid crystal compound or a polymerizable liquid crystal compound described later.

In order to form one kind of cholesteric liquid crystal layer having the same center wavelength of selective reflection, it is also possible to laminate a plurality of cholesteric liquid crystal layers having the same cycle P and the same helical sense. By laminating the cholesteric liquid crystal layers having the same cycle P and the same sense of the helix, it is possible to increase circular polarization selectivity at a specific wavelength.

(Method of Preparing Cholesteric Liquid Crystal Layer)

Hereinafter, a method of preparing a cholesteric liquid crystal layer will be described.

For forming the cholesteric liquid crystal layer, a liquid crystal composition including a polymerizable liquid crystal compound is used. The liquid crystal composition may further include a chiral agent (optically active compound). The liquid crystal composition dissolved in a solvent or the like by further mixing with a surfactant or a polymerization initiator, if necessary, is applied to a support, an alignment layer, a cholesteric liquid crystal layer which becomes an underlayer, and the like, after alignment and aging, the liquid crystal composition is cured to immobilize the liquid crystal compound, and thus, the cholesteric liquid crystal layer can be formed.

(Polymerizable Liquid Crystal Compound)

The polymerizable liquid crystal compound may be a rod-like liquid crystal compound or a disk-like liquid crystal compound, and it is preferable that the polymerizable liquid crystal compound is a rod-like liquid crystal compound.

Examples of a rod-like polymerizable liquid crystal compound include a rod-like nematic liquid crystal compound. As the rod-like nematic liquid crystal compound, azomethines, azoxys, cyanobiphenyls, cyanophenyl esters, benzoic acid esters, cyclohexane carboxylic acid phenyl esters, cyanophenyl cyclohexanes, cyano-substituted phenyl pyrimidines, alkoxy-substituted phenyl pyrimidines, phenyl dioxanes, trans, and alkenyl cyclohexyl benzonitriles are preferably used. Not only a low molecular liquid crystal compound but also a high molecular liquid crystal compound can be used for the rod-like nematic liquid crystal compound.

The polymerizable liquid crystal compound can be obtained by introducing a polymerizable group into a liquid crystal compound. Examples of the polymerizable group include an unsaturated polymerizable group, an epoxy group, an oxetanyl group, and an aziridinyl group, an unsaturated polymerizable group is preferable, and an ethylenically unsaturated polymerizable group is particularly preferable. The polymerizable group can be introduced into the molecules of the liquid crystal compound by various methods. The number of polymerizable groups of the polymerizable liquid crystal compound is preferably 1 to 6 and is more preferably 1 to 3. Examples of the polymerizable liquid crystal compound include compounds described in Makromol. Chem., Vol. 190, Page 2255 (1989), Advanced Materials Vol. 5, Page 107 (1993), U.S. Pat. Nos. 4,683, 327A, 5,622,648A, 5,770,107A, WO95/022586A, WO95/024455A, WO97/000600A, WO98/023580A, WO98/052905A, JP1989-272551A (JP-H01-272551A), JP1994-016616A (JP-H06-016616A), JP1995-110469A (JP-H07-110469A), JP1999-080081A (JP-H11-080081A), JP2001-328973A, JP2009-069793A, JP2010-13249A, JP2011-203636A, and the like.

In addition, as polymerizable liquid crystal compounds other than the above compounds, cyclic organopolysiloxane compounds having a cholesteric liquid crystalline phase as disclosed in JP1982-165480A (JP-S57-165480A) can be used. Further, as the polymer liquid crystal compound, for example, a polymer in which a liquid crystal mesogenic group is introduced into a main chain, a side chain, or both a main chain and a side chain, a polymer cholesteric liquid crystal in which a cholesteryl group is introduced into a side chain, a liquid crystal polymer described in JP1997-133810A (JP-H09-133810A), and a liquid crystal polymer described in JP1999-293252A (JP-H11-293252A) can be used.

As the polymerizable liquid crystal compound, it is preferable to use a liquid crystal compound having two or more reactive groups having different polymerization conditions in the same molecule. Examples of combinations of reactive groups having different polymerization conditions include combinations of radically photopolymerizable reactive groups and cationically photopolymerizable reactive groups.

As described above, in order to set the wavelength range of the reflection of the polarization separation site to be wider than the wavelength range of the light emitted from the organic electroluminescent layer, it is preferable to use a liquid crystal compound exhibiting a high refractive index anisotropy Δn. As seen from the equation (Δλ=Δn×P), it is possible to obtain a wide half-width Δλ by using a liquid crystal compound exhibiting high refractive index anisotropy Δn. Specifically, the Δn of the liquid crystal compound at 30° C. is preferably 0.25 or more, more preferably 0.3 or more, and even more preferably 0.35 or more. The upper limit is not particularly limited, but is often 0.6 or less.

As the measurement method of the refractive index anisotropy Δn, a method using a wedge-like liquid crystal cell described in Liquid Crystal Handbook (edited by Liquid crystal handbook editing committee, published by Maruzen), Page. 202, is generally used and in a case of a compound which is easily crystallized, it is possible to estimate the refractive index anisotropy Δn from the extrapolated value by performing evaluation as a mixture with another liquid crystal.

Examples of the liquid crystal compound exhibiting high refractive index anisotropy Δn include compounds described in U.S. Pat. No. 6,514,578B, JP3999400B, JP4117832B, JP4517416B, JP4836335B, JP5411770B, JP5411771B, JP5510321B, JP5705465B, JP5721484B, and JP5723641B.

Examples of preferable examples of the polymerizable liquid crystal compound used in the present invention include a compound represented by Formula (I) or (II). The compound represented by Formula (I) or (II) exhibits high refractive index anisotropy Δn.

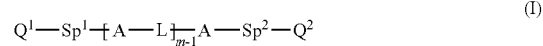

(I)

In the formula,

A represents a divalent aromatic ring group which may have a substituent,

L represents a single bond or a linking group selected from the group consisting of —C(=O)O—, —OC(=O)—, —NH—C(=O)—, —C(=O)—NH—, —CH=CH—C(=O)O—, and —OC(=O)—CH=CH—, m represents an integer of 2 to 12, Sp$^1$ and Sp$^2$ each independently represent a single bond, or a linking group selected from the group consisting of a linear or branched alkylene group having 1 to 20 carbon atoms and a group in which one or two or more —CH$_2$—'s in the linear or branched alkylene group having 1 to 20 carbon atoms are substituted with —O—, —S—, —NH—, —N(CH$_3$)—, —C(=O)—, —OC(=O)—, or —C(=O)O—, and Q$^1$ and Q$^2$ each independently represent a polymerizable group.

A is a divalent aromatic ring group which may have a substituent. The divalent aromatic ring group is a group formed by removing two hydrogen atoms from an aromatic ring, and examples of the aromatic ring include benzene, naphthalene, furan, thiophene, pyrrole, pyrazole, imidazole, pyridine, pyridazine, pyrimidine, and pyrazine. As the divalent aromatic ring group, a phenylene group is preferable, and a 1,4-phenylene group is particularly preferable.

Each of m A's and m−1 L's may be the same or different from each other.

In the divalent aromatic ring group, the substituent of "which may have a substituent" is not particularly limited, and examples thereof include an alkyl group, a cycloalkyl group, an alkoxy group, an allyl ether group, an amide group, an amino group, a halogen atom, and a substituent selected from the group consisting of groups formed by combining two or more of the above-mentioned substituent groups. In addition, as an example of the substituent is a substituent represented by —C(=O)—X³-Sp³-Q³. Here, X³ represents a single bond, —O—, —S—, —NH—, or —N(CH₃)—, Sp³ has the same meaning as Sp¹, and Q³ represents a polymerizable group. The divalent aromatic ring group may have 1 to 4 substituents. When the divalent aromatic ring group has two or more substituents, the two or more substituents may be the same or different from each other.

In the present specification, an alkyl group may be linear or branched. The number of carbon atoms of the alkyl group is preferably 1 to 30, more preferably 1 to 10, and particularly preferably 1 to 6. Examples of the alkyl group include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a 1,1-dimethylpropyl group, an n-hexyl group, an isohexyl group, a linear or branched heptyl group, an octyl group, a nonyl group, a decyl group, an undecyl group, and a dodecyl group. The above description of the alkyl group applies to the alkoxy group containing an alkyl group in the same manner. Examples of the halogen atom include a fluorine atom, a chlorine atom, a bromine atom, and an iodine atom.

In the present specification, the number of carbon atoms of the cycloalkyl group is preferably 3 to 20, more preferably 5 to 10 or less. Examples of the cycloalkyl group include a cyclopropyl group, a cyclobutyl group, a cyclopentyl group, a cyclohexyl group, a cyclopentyl group, and a cyclooctyl group.

L represents a single bond or a linking group selected from the group consisting of —C(=O)O—, —OC(=O)—, —NH—C(=O)—, —C(=O)—NH—, —CH=CH—C(=O)O—, and —OC(=O)—CH=CH—. L is preferably —C(=O)O—, —OC(=O)—, —NH—C(=O)—, or —C(=O)—NH—. Each of m L's may be the same or different from each other.

m represents an integer of 2 to 12, preferably represents an integer of 3 to 7, and more preferably represents an integer of 3 to 5.

Sp¹ and Sp² each independently represent a single bond, or a linking group selected from the group consisting of a linear or branched alkylene group having 1 to 20 carbon atoms and a group in which one or two or more —CH₂—'s in the linear or branched alkylene group having 1 to 20 carbon atoms are substituted with —O—, —S—, —NH—, —N(CH₃)—, —C(=O)—, —OC(=O)—, or —C(=O)O—. Sp¹ and Sp² preferably each independently represent a linear alkylene group having 1 to 10 carbon atoms to which a linking group selected from the group consisting of —O—, —OC(=O)—, and —C(=O)O— is respectively bonded to both terminals, and a linking group formed by combining one or two or more groups selected from the group consisting of —OC(=O)—, —C(=O)O—, —O—, and a linear alkylene group having 1 to 10 carbon atoms, and more preferably each independently represent a linear alkylene group having 1 to 10 carbon atoms to which a linking group selected from the group consisting of —O—, —OC(=O)—, —C(=O)O—, —OC(=O)—, and —OC(=O)O— is respectively bonded to both terminals.

Q¹ and Q² each independently represent a polymerizable group, and preferably represent a polymerizable group selected from the group consisting of the groups represented by Formulae (Q-1) to (Q-5).

(Q-1)

(Q-2)

(Q-3)

(Q-4)

(Q-5)

As the polymerizable group, an acryloyl group (Formula (Q-1)), a methacryloyl group (Formula (Q-2)) and an oxetanyl group (Formula (Q-5)) are preferable. A compound in which both Q¹ and Q² are acryloyl groups or methacryloyl groups, and a compound in which one of Q¹ and Q² is an acryloyl group or methacryloyl group and the other is an oxetanyl group is more preferable.

The compound represented by Formula (I) can be synthesized by the method described in JP1999-513019A (JP-H11-513019A) (WO97/000600).

Examples of the polymerizable compound represented by Formula (I) are shown below, but the present invention is not limited to these examples.

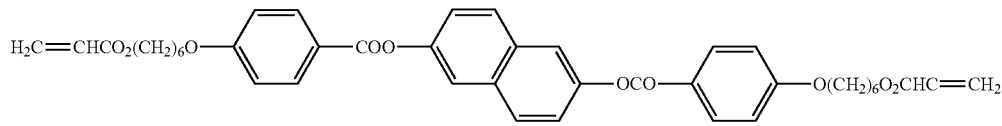

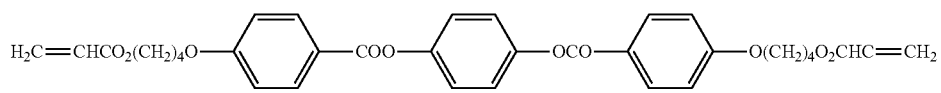

-continued
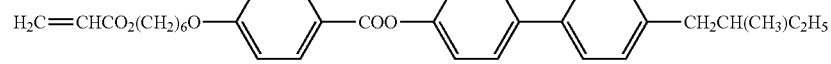
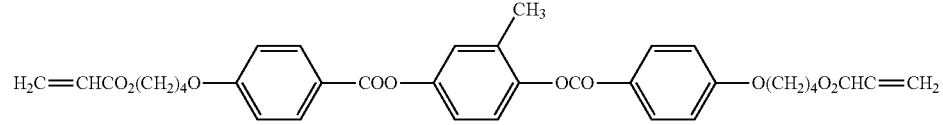
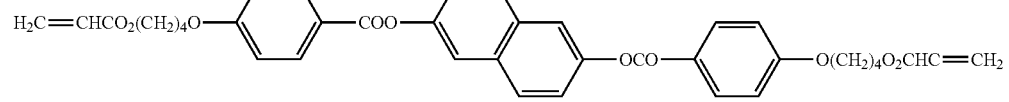
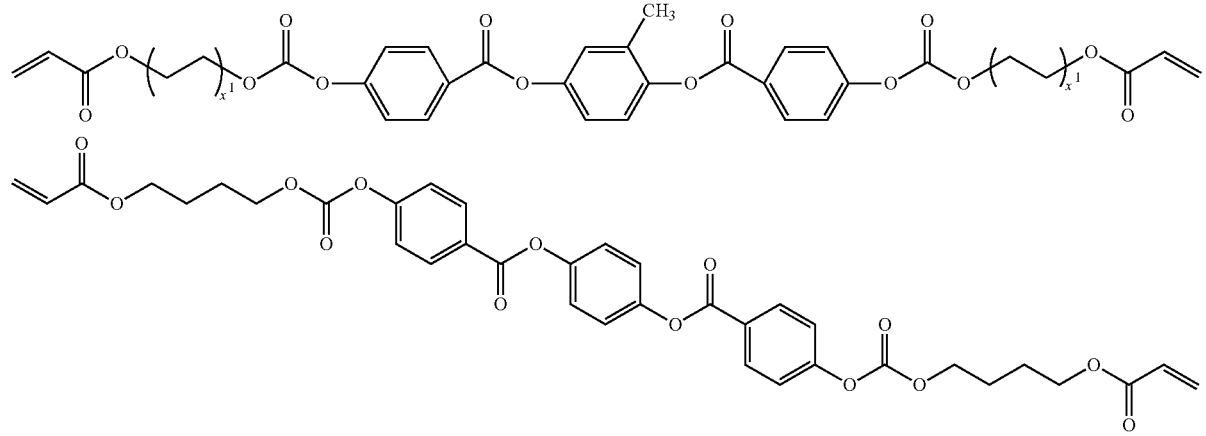
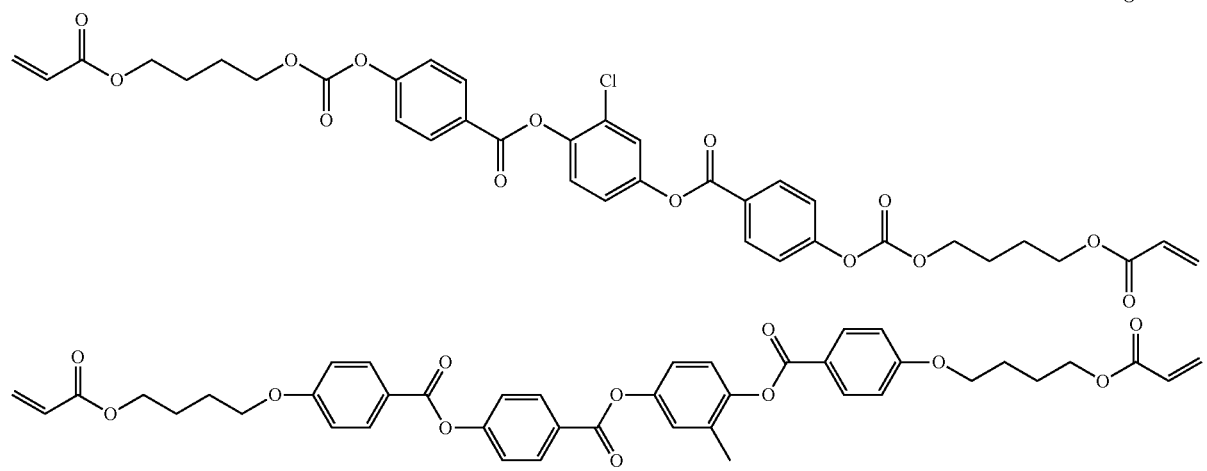
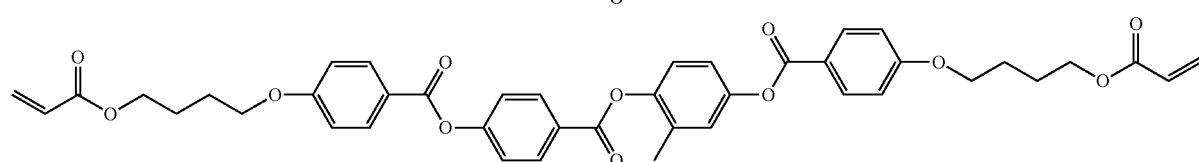
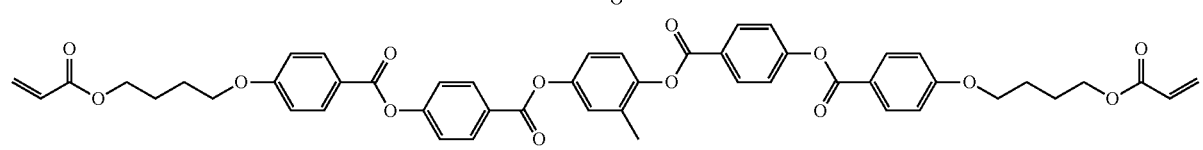

-continued

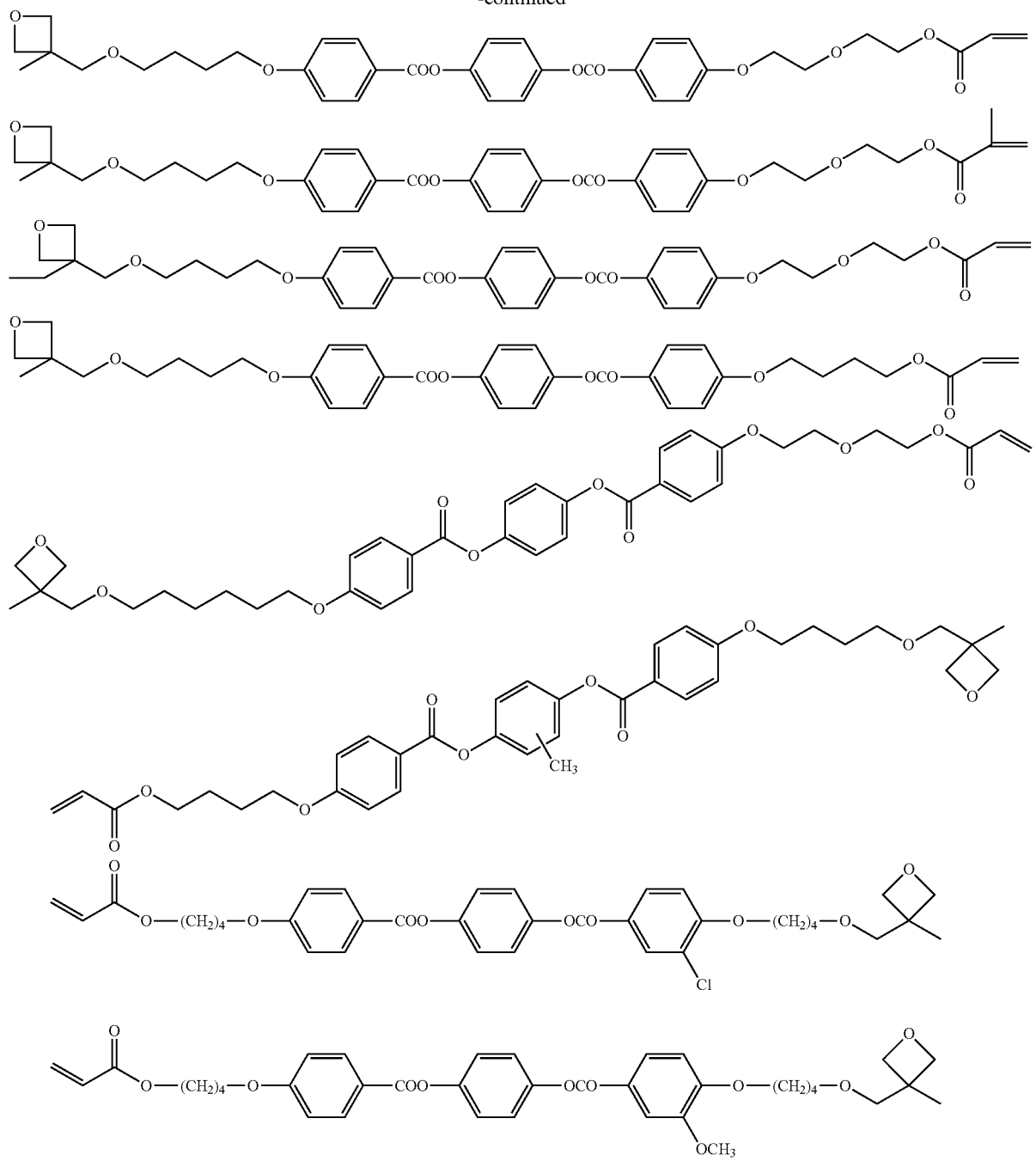

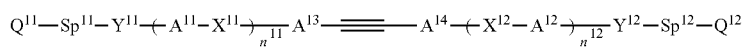

(II)

X¹ is 2 to 5 (integer)

$A^{11}$ to $A^{14}$ each independently represent a divalent aromatic carbon group or a divalent heterocyclic group which may have a substituent. The divalent aromatic carbon group is a group formed by removing two hydrogen atoms from an aromatic carbon ring and the divalent heterocyclic group is a group formed by removing two hydrogen atoms from a heterocyclic ring. Examples of the aromatic carbon ring include a benzene ring and a naphthalene ring. Examples of the heterocyclic ring include a furan ring, a thiophene ring, a pyrrole ring, a pyrroline ring, a pyrrolidine ring, an oxazole ring, an isoxazole ring, a thiazole ring, an isothiazole ring, an imidazole ring, an imidazoline ring, an imidazolidine ring, a pyrazole ring, a pyrazoline ring, a pyrazolidine ring, a triazole ring, a furazan ring, a tetrazole ring, a pyran ring, a thiine ring, a pyridine ring, a piperidine ring, an oxazine ring, a morpholine ring, a thiazine ring, a pyridazine ring, a pyrimidine ring, a pyrazine ring, a piperazine ring, and a triazine ring. Among these, $A^{11}$ to $A^{14}$ preferably represent a divalent aromatic carbon group, more preferably represent a phenylene group, and even more preferably represent a 1,4-phenylene group.

The kind of the substituent which may be substituted on the aromatic carbocyclic group or heterocyclic group is not particularly limited and examples thereof include a halogen atom, a cyano group, a nitro group, an alkyl group, a halogen substituted alkyl group, an alkoxy group, an alkylthio group, an acyloxy group, an alkoxycarbonyl group, a carbamoyl group, an alkyl substituted carbamoyl group, and an acylamino group having 2 to 6 carbon atoms.

$X^{11}$ and $X^{12}$ each independently represent a single bond, —COO—, —OCO—, —CONH—, —NHCO—, —CH$_2$CH$_2$—, —OCH$_2$—, —CH$_2$O—, —CH=CH—, —CH=CH—COO—, —OCO—CH=CH— or —C≡C—. Among these, a single bond, —COO—, —CONH—, —NHCO—, or —C≡C— is preferable.

$Y^{11}$ and $Y^{12}$ each independently represent a single bond or —O—, —S—, —CO—, —COO—, —OCO—, —CONH—, —NHCO—, —CH=CH—, —CH=CH—COO—, —OCO—CH=CH—, or —C≡C—. Among these, —O— is preferable.

$Sp^{11}$ and $Sp^{12}$ each independently represent a single bond or an alkylene group having 1 to 25 carbon atoms. The alkylene group may be linear, branched, or cyclic. Among these, an alkylene group having 1 to 10 carbon atoms is more preferable.

$Q^{11}$ and $Q^{12}$ each independently represent a hydrogen atom or a polymerizable group, and at least one of $Q^{11}$ or $Q^{12}$ represents a polymerizable group. Examples of the polymerizable group include polymerizable groups selected from the group consisting of the groups represented by Formulae (Q-1) to (Q-5). As the polymerizable group represented by $Q^{11}$ or $Q^{12}$, an acryloyl group (Formula (Q-1)) and a methacryloyl group (Formula (Q-2)) are preferable.

$n^{11}$ and $n^{12}$ each independently represent an integer of 0 to 2, and in a case where $n^{11}$ or $n^{12}$ is 2, a plurality of $A^{11}$'s $A^{12}$'s $X^{11}$'s and $X^{12}$'s may be the same or different from each other.

Specific examples of the compound represented by Formula (II) include the compounds shown in Formulas (2-1) to (2-30).

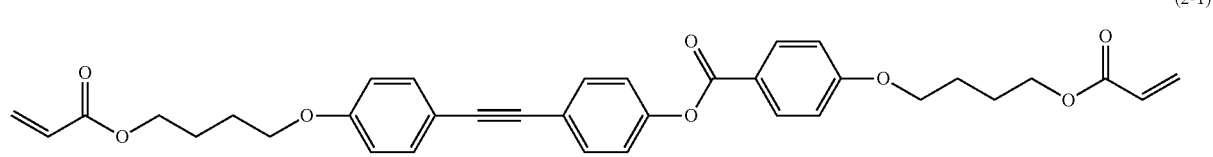

(2-1)

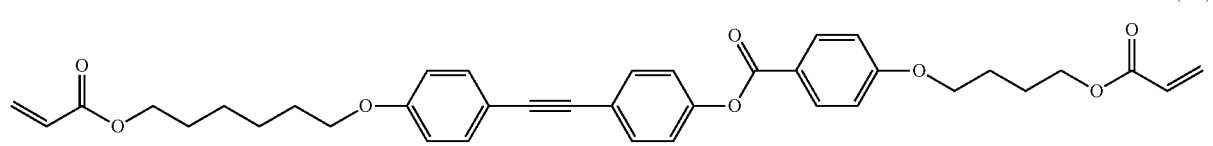

(2-2)

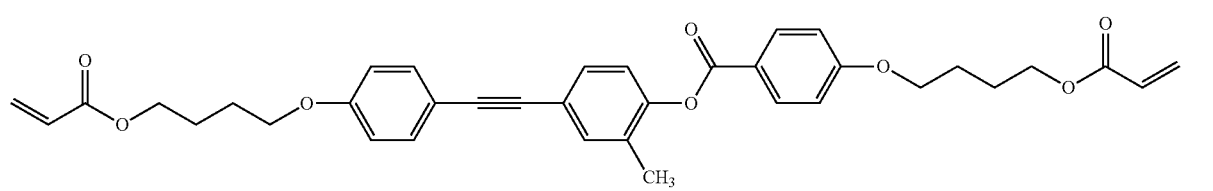

(2-3)

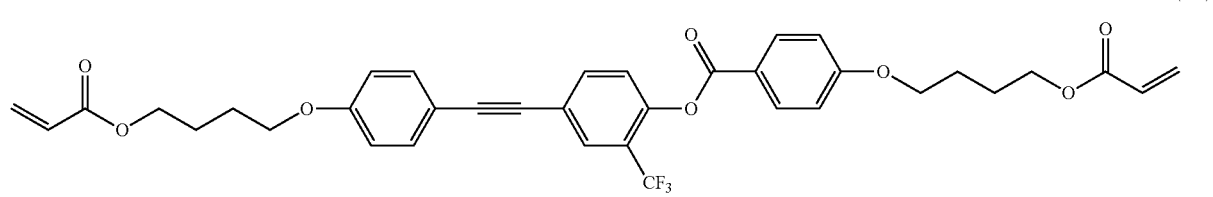

(2-4)

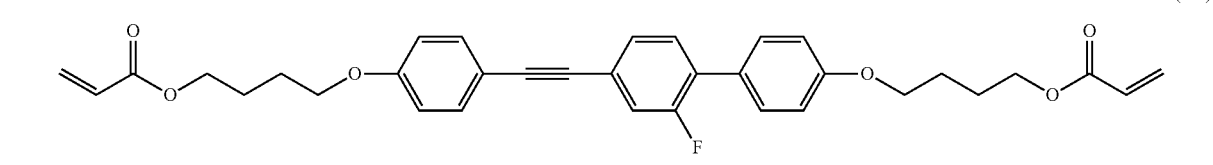

(2-5)

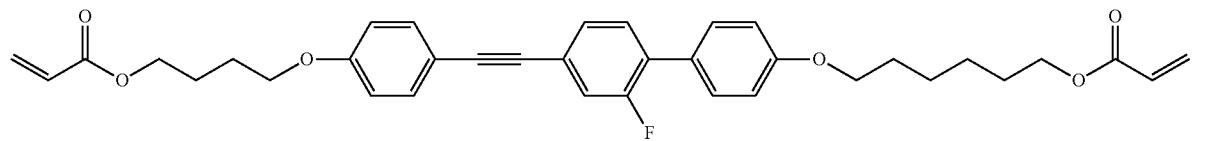

(2-6)

-continued
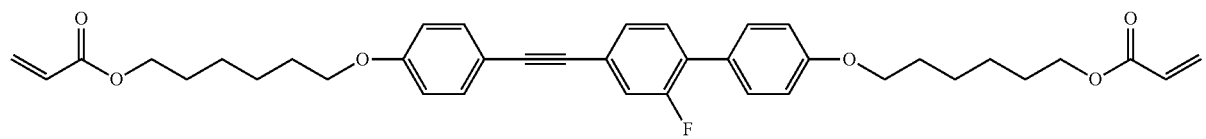
(2-7)
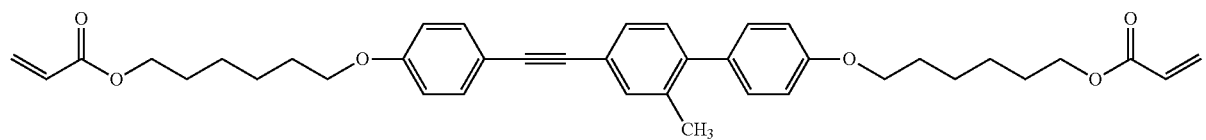
(2-8)
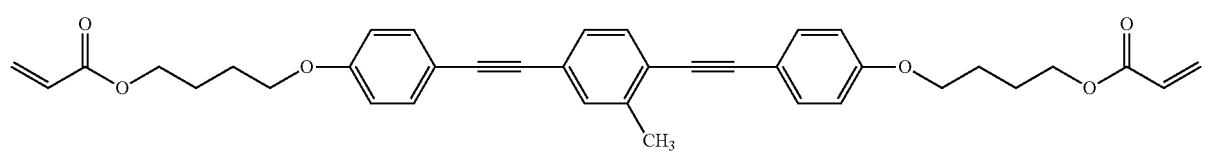
(2-9)
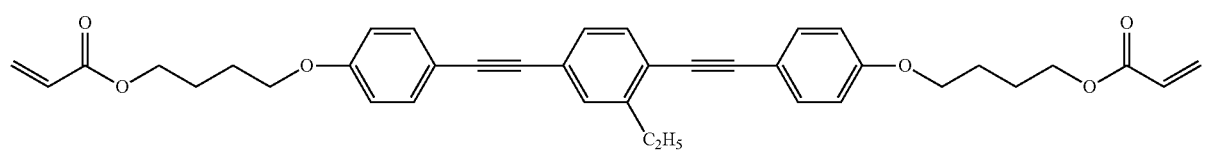
(2-10)
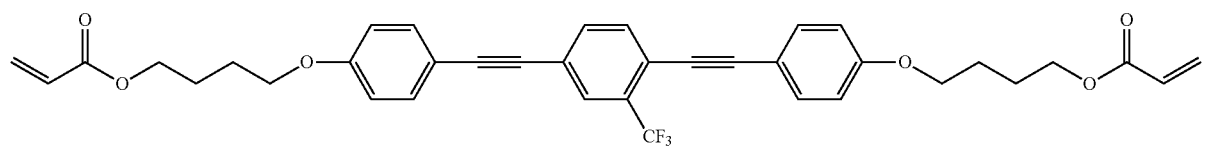
(2-11)
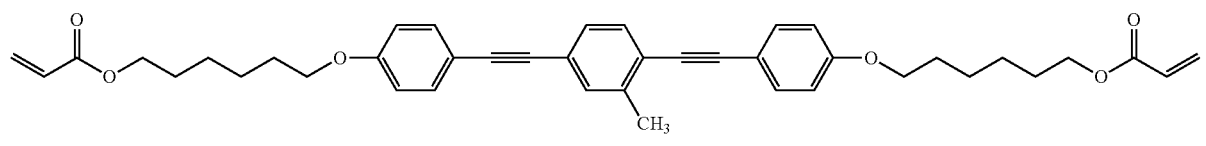
(2-12)
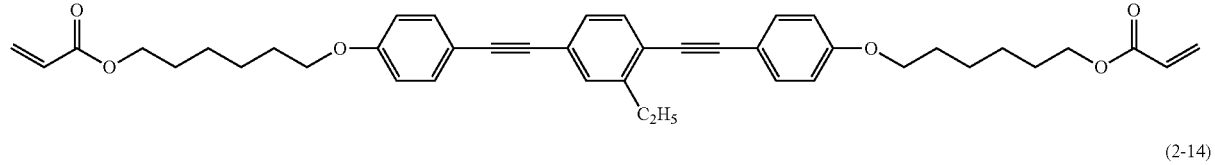
(2-13)
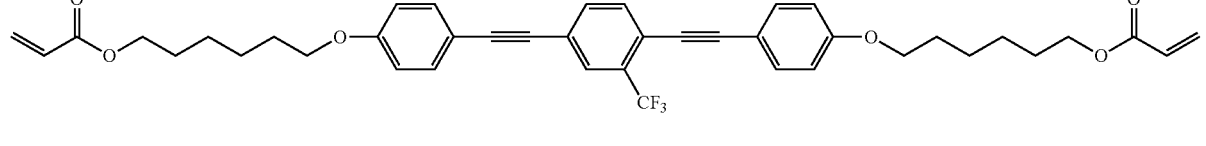
(2-14)
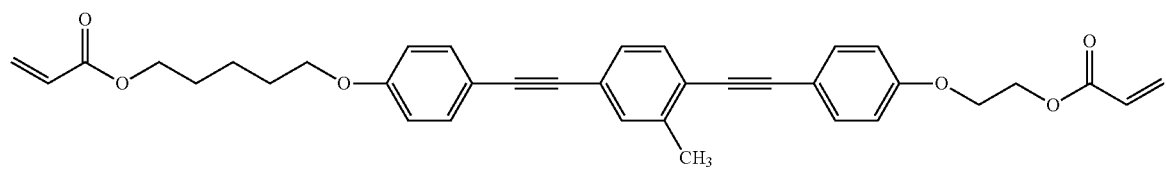
(2-15)

-continued
(2-16)
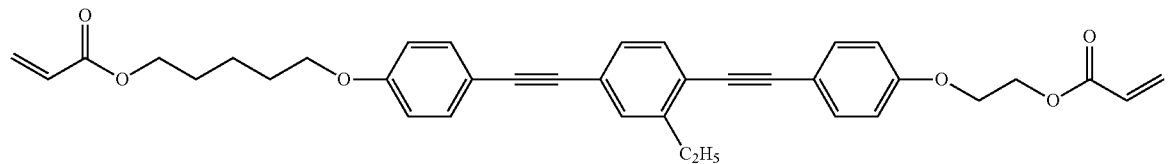
(2-17)
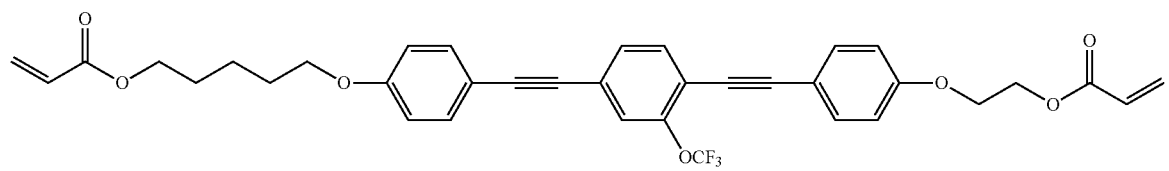
(2-18)
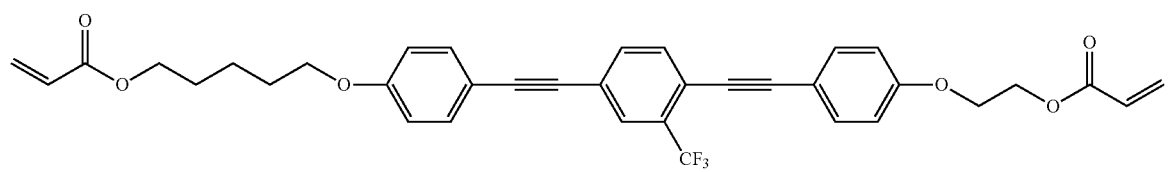
(2-19)
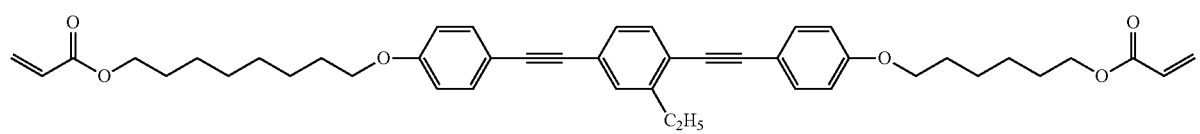
(2-20)
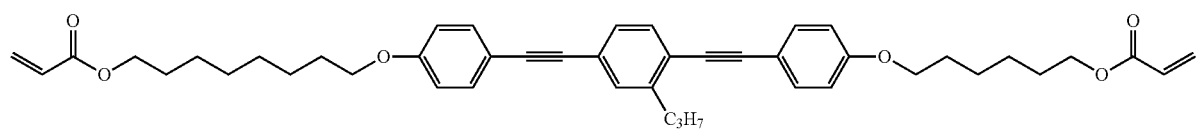
(2-21)
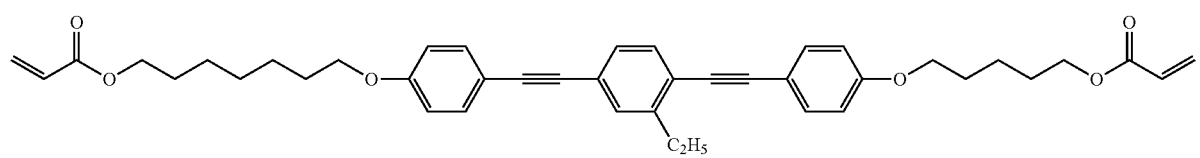
(2-22)
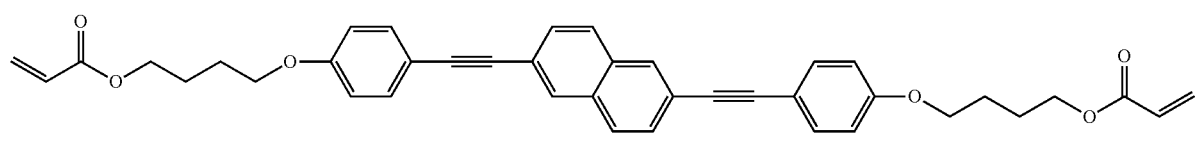
(2-23)
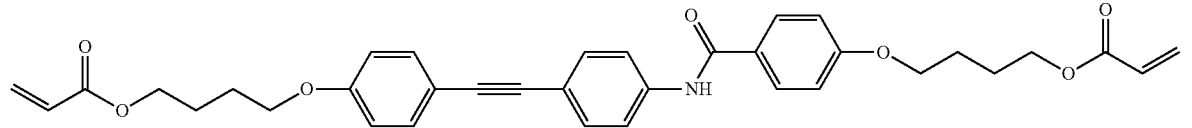
(2-24)
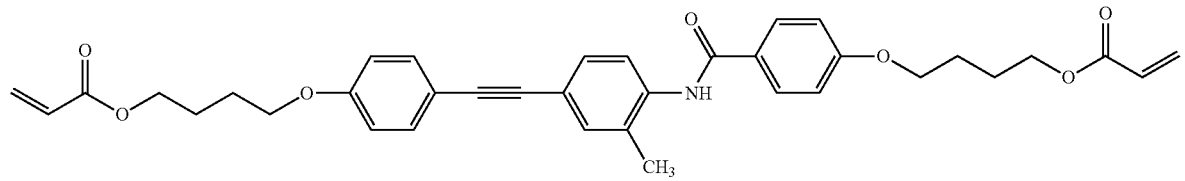

-continued

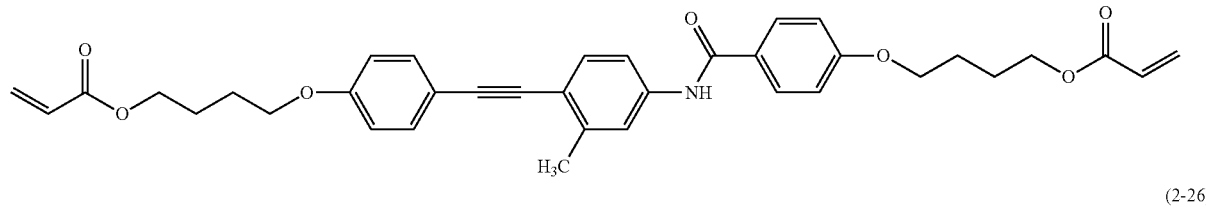
(2-25)

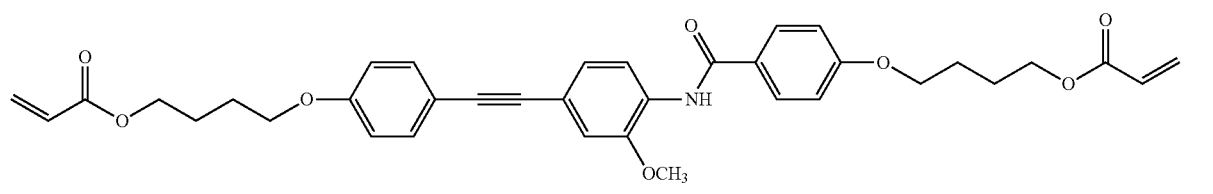
(2-26)

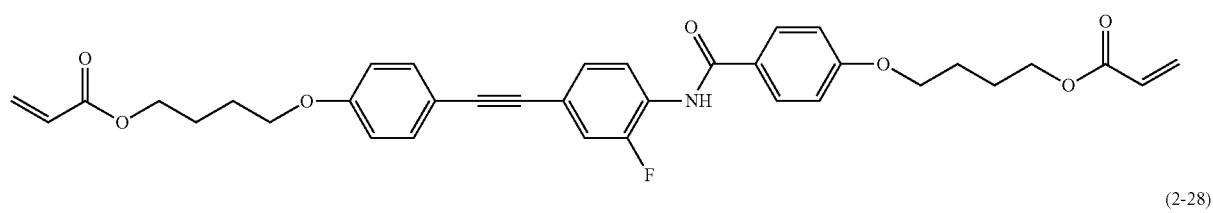
(2-27)

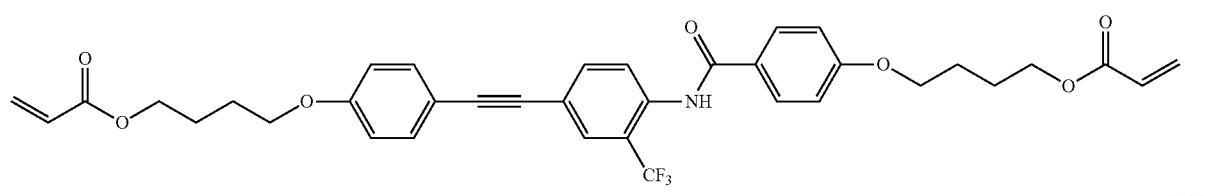
(2-28)

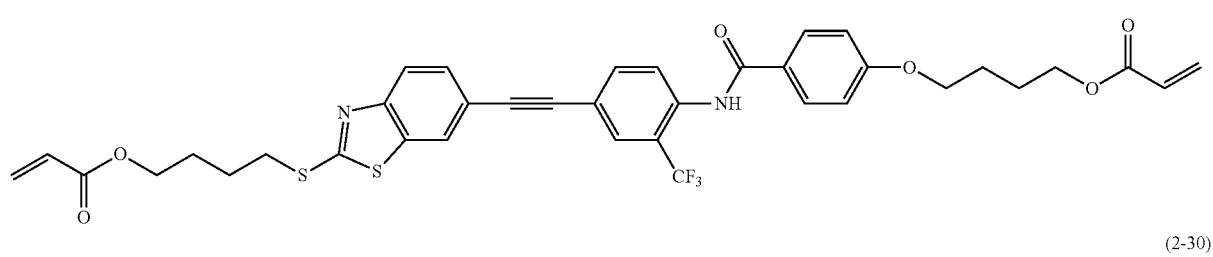
(2-29)

(2-30)

Two or more of polymerizable liquid crystal compounds may be used in combination. In a case where two or more polymerizable liquid crystal compounds are used together, the alignment temperature can be lowered.

In addition, in a case where a liquid crystal compound having two or more reactive groups having different polymerization conditions in the same molecule and a liquid crystal compound having two or more reactive groups having the same polymerization condition in the same molecule are used in combination, the reflection range of the selective reflection can be widened and thus this case is more preferable. Specifically, a combination of a liquid crystal compound containing a (meth)acryloyl group and an oxetanyl group and a liquid crystal compound containing two (meth)acryloyl groups can be exemplified.

The amount of the polymerizable liquid crystal compound added in the liquid crystal composition is preferably 80% to 99.9% by mass, more preferably 85% to 99.5% by mass, and particularly preferably 90% to 99% by mass with respect to the solid content mass (excluding the solvent) of the liquid crystal composition.

(Chiral Agent: Optically Active Compound)

It is preferable that the material used for forming the cholesteric liquid crystal layer includes a chiral agent. The chiral agent has a function of causing a helical structure of a cholesteric liquid crystalline phase. The chiral compound may be selected depending on the purpose because the twisted direction of the helix or the helical pitch derived from the compound varies.

The chiral agent is not particularly limited, and a well-known compound can be used. Examples of the chiral agent include compounds described in Liquid Crystal Device Handbook (No. 142 Committee of Japan Society for the Promotion of Science, 1989, Chapter 3, Article 4-3, chiral agent for TN or STN, p. 199), JP2003-287623A, JP2002-302487A, JP2002-080478A, JP2002-080851A, JP2010-181852A, and JP2014-034581A.

Although the chiral agent generally contains an asymmetric carbon atom, an axial asymmetric compound or planar asymmetric compound not containing an asymmetric carbon atom can also be used as the chiral agent. Examples of the axial asymmetric compound or the planar asymmetric compound include binaphthyl, helixene, paracyclophane, and derivatives thereof. The chiral agent may have a polymerizable group. In a case where both the chiral agent and the liquid crystal compound have a polymerizable group, a polymer having a repeating unit derived from the polymerizable liquid crystal compound and a repeating unit derived from the chiral agent can be formed by the polymerization reaction between the polymerizable chiral agent and the polymerizable liquid crystal compound. In this embodiment, the polymerizable group in the polymerizable chiral agent is preferably the same group as the polymerizable group in the polymerizable liquid crystal compound. Accordingly, the polymerizable group of the chiral agent is preferably an unsaturated polymerizable group, an epoxy group or an aziridinyl group, and more preferably an unsaturated polymerizable group, and particularly preferably an ethylenically unsaturated polymerizable group.

In addition, the chiral agent may be a liquid crystal compound.

As the chiral agent, an isosorbide derivative, an isomannide derivative, and a binaphthyl derivative can be preferably used. As the isosorbide derivative, commercially available products such as LC-756 manufactured by BASF SE may be used.

The content of the chiral agent in the liquid crystal composition is preferably 0.01% by mole to 200% by mole and more preferably 1% by mole to 30% by mole with respect to the total molar amount of the polymerizable liquid crystal compound.

(Polymerization Initiator)

It is preferable that the liquid crystal composition contains a polymerization initiator. In a state in which a curing reaction is carried out by ultraviolet irradiation, it is preferable that a polymerization initiator to be used is a photopolymerization initiator which can initiate a polymerization reaction by ultraviolet irradiation. Examples of photopolymerization initiators include a radical polymerization initiator and a cation polymerization initiator.

Examples of the radical polymerization initiator include an α-carbonyl compound (described in the specification of each of U.S. Pat. Nos. 2,367,661A and 2,367,670A), acyloin ether (described in the specification of U.S. Pat. No. 2,448,828A), an α-hydrocarbon-substituted aromatic acyloin compound (described in the specification of U.S. Pat. No. 2,722,512A), a polynuclear quinone compound (described in the specification of each of U.S. Pat. Nos. 3,046,127A and 2,951,758A), a combination between a triaryl imidazole dimer and p-aminophenyl ketone (described in the specification of U.S. Pat. No. 3,549,367A), an acridine compound and a phenazine compound (described in JP1985-105667A (JP-S60-105667A) and in the specification of U.S. Pat. No. 4,239,850A), an acylphosphineoxide compound (described in the specification of each of JP1988-040799B (JP-S63-040799B), JP1993-029234B (JP-H05-029234B), JP1998-095788A (JP-H10-095788A), and JP1998-029997A (JP-H10-029997A), JP2001-233842A, JP2000-080068A, JP2006-342166A, JP2013-114249A, JP2014-137466A, JP4223071B, JP2010-262028A, and JP2014-500852A), an oxime compound (described in the specification of each of JP2000-066385A and JP4454067B), and an oxadiazole compound (described in the specification of U.S. Pat. No. 4,212,970A). For example, the description in paragraphs 0500 to 0547 of JP2012-208494A can also be referred to.

As the radical polymerization initiator, it is preferable to use an acyl phosphine oxide compound or an oxime compound.

As the acylphosphineoxide compound, for example, IRGACURE 819 manufactured by BASF SE (compound name: bis(2,4,6-trimethylbenzoyl)-phenylphosphineoxide) which is a commercially available product can be used. As the oxime compound, IRGACURE OXE01 (manufactured by BASF SE), IRGACURE OXE02 (manufactured by BASF SE), TR-PBG-304 (manufactured by Changzhou Tronly New Electronic Materials Co., Ltd.), ADEKA ARKLS NCI-831 and ADEKA ARKLS NCI-930 (manufactured by ADEKA CORPORATION) which are commercially available products can be used.

Examples of the cationic polymerization initiator include organic sulfonium salt-based, iodonium salt-based, and phosphonium salt-based compounds, an organic sulfonium salt-based compound is preferable and a triphenylsulfonium salt is particularly preferable. As counter ions of these compounds, hexafluoroantimonate, hexafluorophosphate and the like are preferably used.

The polymerization initiator may be used alone or in combination of two or more thereof.

The content of the photopolymerization initiator in the liquid crystal composition is preferably 0.1% by mass to 20% by mass and more preferably 0.5% by mass to 5% by mass with respect to the content of the polymerizable liquid crystal compound.

(Crosslinking Agent)

The liquid crystal composition may optionally contain a crosslinking agent in order to improve film hardness after curing and improve durability. As the crosslinking agent, those that are curable by ultraviolet rays, heat, moisture or the like can be suitably used.

The crosslinking agent is not particularly limited, and can be appropriately selected according to the purpose. Examples thereof include polyfunctional acrylate compounds such as trimethylolpropane tri(meth)acrylate, pentaerythritol tri(meth)acrylate, and pentaerythritol tetra(meth)acrylate; epoxy compounds such as glycidyl(meth)acrylate and ethylene glycol diglycidyl ether; aziridine compounds such as 2,2-bis-hydroxymethyl butanol-tris[3-(1-aziridinyl)propionate] and 4,4-bis(ethyleneiminocarbonylamino)diphenylmethane; isocyanate compounds such as hexamethylene diisocyanate and biuret type isocyanate; polyoxazoline compounds having an oxazoline group on a side chain; and alkoxysilane compounds such as vinyltrimethoxysilane and N-(2-aminoethyl)-3-aminopropyltrimethoxysilane. Among these, polyfunctional acrylate compounds are preferable. As the polyfunctional acrylate compound, a tri- to hexafunctional acrylate compound is preferable, and a tetra- to hexafunctional acrylate compound is more preferable. Furthermore, according to the reactivity of the crosslinking agent, a known catalyst can be used, and the productivity can be improved in addition to the improvement of film hardness and durability. These may be used alone or in combination of two or more thereof.

The content of the crosslinking agent in the liquid crystal composition is preferably 0 parts by mass to 8.0 parts by mass, more preferably 0.1 parts by mass to 7.0 parts by mass, and even more preferably 0.2 parts by mass to 5.5 parts by mass with respect to 100 parts by mass of the polymerizable liquid crystal compound in the liquid crystal composition.

(Alignment Control Agent)

In the liquid crystal composition, an alignment control agent which contributes to planar alignment stably or rapidly may be added. Examples of the alignment control agent include fluorine (meth)acrylate-based polymers described in paragraphs 0018 to 0043 of JP2007-272185A, and compounds represented by Formulae (I) to (IV) described in paragraphs 0031 to 0034 of JP2012-203237A.

The alignment control agent may be used alone or in combination of two or more thereof.

The amount of the alignment control agent added in the liquid crystal composition is preferably 0.01% by mass to 10% by mass, more preferably 0.01% by mass to 5.0% by mass, and particularly preferably 0.02% by mass to 1.0% by mass with respect to the total mass of the polymerizable liquid crystal compound.

(Other Additives)

In addition, the liquid crystal composition may contain at least one component selected from various additives such as a surfactant, which is for making the film thickness uniform by adjusting the surface tension of the coating film, and a polymerizable monomer. Furthermore, if necessary, a polymerization inhibitor, an antioxidant, an ultraviolet absorber, a light stabilizer, a coloring material, metal oxide particles, and the like can be added to the liquid crystal composition within a range that does not deteriorate the optical performance.

(Solvent)

The solvent used for preparing the liquid crystal composition is not particularly limited and can be appropriately selected according to the purpose.

The organic solvent is not particularly limited and can be appropriately selected according to the purpose. Examples of the organic solvent include ketones, alkyl halides, amides, sulfoxides, heterocyclic compounds, hydrocarbons, esters, ethers, and the like. These may be used alone or in combination of two or more thereof. Among these, considering the load imposed on the environment, ketones are particularly preferable.

(Coating, Alignment, and Polymerization)

The method of applying the liquid crystal composition to a support, an alignment layer, a ¼ wavelength plate, and a cholesteric liquid crystal layer which becomes an underlayer is not particularly limited and can be appropriately selected according to the purpose. Examples of the coating method include a wire bar coating method, a curtain coating method, an extrusion coating method, a direct gravure coating method, a reverse gravure coating method, a die coating method, a spin coating method, a dip coating method, a spray coating method, and a slide coating method. Furthermore, the coating method can be performed by transferring the liquid crystal composition, which is separately applied onto a support. By heating the applied liquid crystal composition, the liquid crystal molecules are aligned. Cholesteric alignment may be performed in forming the cholesteric liquid crystal layer, and nematic alignment may be performed in forming the ¼ wavelength plate. In the case of cholesteric alignment, the heating temperature is preferably 200° C. or lower and more preferably 130° C. or lower. By this alignment treatment, an optical thin film is obtained in which the polymerizable liquid crystal compound is twist-aligned so as to have a helical axis in a direction substantially perpendicular to the film surface. In the case of the nematic alignment, the heating temperature is preferably 50° C. to 120° C. and more preferably 60° C. to 100° C.

The aligned liquid crystal compound can be further polymerized to cure the liquid crystal composition. The polymerization may be any of thermal polymerization and photopolymerization performed using light irradiation, but photopolymerization is preferable. It is preferable to use ultraviolet rays for the light irradiation. The irradiation energy is preferably 20 mJ/cm$^2$ to 50 J/cm$^2$ and more preferably 100 mJ/cm$^2$ to 1,500 mJ/cm$^2$. In order to accelerate the photopolymerization reaction, the light irradiation may be performed under heating conditions or in a nitrogen atmosphere. The wavelength of the ultraviolet rays for irradiation is preferably 350 nm to 430 nm. From the viewpoint of stability, the polymerization reaction rate is preferably high. The polymerization reaction rate is preferably 70% or more and more preferably 80% or more. The polymerization reaction rate can be determined by measuring the consumption rate of polymerizable functional groups by using an IR absorption spectrum.

The thickness of each of the cholesteric liquid crystal layers is not particularly limited as long as the above properties are exhibited. The thickness is preferably in a range of 1.0 μm or more and 20 μm or less and more preferably in a range of 2.0 μm or more and 10 μm or less.

(Support)

The liquid crystal composition may be applied to a support or the surface of an alignment layer formed on the surface of the support to form a layer. The support or the support and the alignment layer may be peeled off after layer formation. For example, the layer may be peeled off after bonding to the light emitting element substrate. Examples of the support include polyester such as polyethylene terephthalate (PET), polycarbonate, an acrylic resin, an epoxy resin, polyurethane, polyamide, polyolefin, a cellulose derivative, silicone, and a glass plate.

The thickness of the support may be about 5 μm to 1000 μm, preferably 10 μm to 250 μm, and more preferably 15 μm to 120 μm.

(Alignment Layer)

In a case of forming a cholesteric liquid crystal layer, it is preferable to regulate the alignment state of the liquid crystal composition by an alignment layer provided directly on or above the support. The alignment layer may be any layer as long as alignment can be imparted to the optically anisotropic layer. Preferable examples of the alignment layer include a rubbed layer of an organic compound such as a polymer (resin such as polyimide, polyvinyl alcohol, polyester, polyarylate, polyamide imide, polyether imide, polyamide, or modified polyamide), a photo alignment layer that exhibits liquid crystal alignment by polarized light irradiation represented by an azobenzene polymer and a cinnamate polymer, an oblique deposition layer of an inorganic compound, a layer with microgrooves, an accumulation film formed of ω-trichosanic acid, dioctadecyl methyl ammonium chloride and methyl stearylate by the Langmuir-Blodgett method (LB film), and a layer in which the dielectric is aligned by application of an electric field or a magnetic field. As the alignment layer, the rubbing layer preferably contains polyvinyl alcohol, and the alignment layer is particularly preferably crosslinkable with at least one layer above or below the alignment layer. Specifically, alignment layers described in JP2009-069793A, JP2010-113249A, and JP2011-203636A can be used. Also, a photo alignment layer can be suitably used. In a case where a photo alignment layer is used, the generation of alignment defects due to minute foreign substances can be suppressed, and the cholesteric liquid crystal layer can be formed with high optical performance even with a fine shape. For example, a liquid crystal alignment agent described in JP2015-26050A (for example, a liquid crystal alignment agent containing an epoxy-containing polyorganosiloxane) can be used. In order to sufficiently exhibit the alignment control force of the alignment layer, the temperature of the applied liquid crystal composition may be controlled to carry out a treatment (alignment treatment) to develop a desired phase.

The thickness of the alignment layer is preferably 0.01 µm to 5.0 µm, and more preferably 0.05 µm to 2.0 µm.

(Patterning Method)

A cholesteric liquid crystal layer can be formed by patterning to form a polarization separation layer including a plurality of polarization separation sites exhibiting polarization separation at different wavelengths. The light utilization efficiency can be further enhanced by using a patterned cholesteric liquid crystal layer in which the selective reflection wavelength is adjusted corresponding to the light emission wavelength of each organic electroluminescent layer of the light emitting element substrate. By forming a cholesteric liquid crystal layer by the patterning method, a polarization separation site and a visible light transmission region in the polarization separation layer can be formed, and the polarization separation sites arranged in the form of a matrix can also be formed.

As the patterning method, a method by solvent development or a method using photoisomerization chiral agent (JP2001-159706A), a method in which alignment is immobilized in advance, and a cholesteric liquid crystal layer is transferred using a laser or a thermal head (JP2001-004822A and JP2001-004824A), an ink jet method (JP2001-159709A), a method of using temperature dependency of a cholesteric helical pitch (JP2001-159708A), and a method of stepwise changing the amount of ultraviolet irradiation in a case of curing a liquid crystal composition between regions may be used.

As an example, a method using a photoisomerization chiral agent can be performed as follows. First, a liquid crystal composition containing a photoisomerization chiral agent is used to form a cholesteric liquid crystal layer having a central wavelength of selective reflection in an ultraviolet wavelength range on the entire surface. Then, a part of the cholesteric liquid crystal layer is immobilized in a state of having a central wavelength of selective reflection in an ultraviolet wavelength range or an infrared light wavelength range by pattern exposure (ultraviolet irradiation) to form a visible light transmission region. Subsequently, light having an absorption wavelength of the chiral agent is selectively emitted to each region with an appropriate light amount according to each of regions having the central wavelength of the selective reflection to be formed. Thus, the chiral agent is isomerized to obtain the pitch of the helical structure according to each region. Finally, by irradiating the entire surface with ultraviolet rays to immobilize the alignment of each region, a polarization separation layer having a visible light transmission region and a pattern of a cholesteric liquid crystal layer having a central wavelength of selective reflection in a desired wavelength range can be formed in one layer.

In the patterning method, pattern exposure can be performed as described above.

The method of pattern exposure includes contact exposure using a mask, proxy exposure, projection exposure and the like. The irradiation wavelength of the light source for the above exposure preferably has a peak at 250 to 450 nm, and more preferably a peak at 300 to 410 nm. Specifically, an ultrahigh pressure mercury lamp, a high pressure mercury lamp, a metal halide lamp, a blue laser and the like can be used. The preferable exposure dose is usually about 3 to 2000 mJ/cm$^2$, more preferably about 5 to 1000 mJ/cm$^2$, even more preferably about 10 to 500 mJ/cm$^2$, and most preferably about 10 to 100 mJ/cm$^2$.

Depending on the material to be used, pattern heating may be performed instead of pattern exposure. As the method of pattern heating, contact heating using a heated patterning plate, heating by an infrared laser, or the like can be used.

In addition, both methods may be combined.

It is also possible to form a polarization separation layer constituted of a plurality of layers as follows using pattern exposure.

That is, after pattern exposure is performed on a layer formed of a first liquid crystal composition, a layer formed of a new second liquid crystal composition can be formed or transferred thereon, and then another pattern exposure can be performed. Furthermore, a layer formed of a new third liquid crystal composition can be formed or transferred thereon, and then another pattern exposure can be performed.

The first liquid crystal composition, the second liquid crystal composition, and the third liquid crystal composition may be derived from the same composition, or may be derived from different compositions. It is also preferable to use three liquid crystal compositions which differ only in the concentration of the chiral agent.

The unexposed region can be made optically isotropic by heating the layer of the pattern-exposed liquid crystal composition at 50° C. to 400° C. and preferably at 80° C. to 200° C. In this manner, a layer having a cholesteric liquid crystal layer in a pattern can be formed. A region which is optically isotropic may be formed to separate the polarization separation site and may be used as a visible light transmission region. A polarization separation layer can be formed by forming each layer having a cholesteric liquid crystal layer in a pattern so as to have a wavelength range corresponding to the color of the light emitted from the organic electroluminescent layer of the light emitting element substrate with respect to a cholesteric liquid crystal layer having a central wavelength of selective reflection in the wavelength range of red light, a cholesteric liquid crystal layer having a central wavelength of selective reflection in the wavelength range of green light, and a cholesteric liquid crystal layer having a central wavelength of selective reflection in the wavelength range of blue light, and laminating a plurality of the layers.

The pattern exposure and the formation of the patterned cholesteric liquid crystal layer (optically anisotropic layer) described in JP2009-069793A, JP2010-113249A, and JP2011-203636A can be referred to.

(Protective Layer (Additive Layer))

Particularly, in a case of forming a polarization separation layer having a polarization separation site in a pattern using a liquid crystal composition, a protective layer may be used. The protective layer may contain at least one or more polymerization initiators having a function of initiating polymerization reaction by unreacted reactive groups remaining after temporary curing of the liquid crystal composition. It is preferable that the cholesteric liquid crystal layer and the protective layer be in direct contact with each other. Although the structure of the protective layer containing a polymerization initiator is not particularly limited, it is preferable to contain at least one polymer other than the polymerization initiator.

The polymer (sometimes referred to as "binder" as another name in the present invention) is not particularly limited, and examples thereof include polymethyl (meth) acrylate, copolymers of (meth)acrylic acid and its various esters, polystyrene, copolymers of styrene and (meth)acrylic acid or various (meth)acrylic acid esters, polyvinyl toluene, copolymers of vinyl toluene and (meth)acrylic acid or various (meth)acrylic esters, a styrene-vinyl toluene copolymer, polyvinyl chloride, polyvinylidene chloride, polyvinyl acetate, a vinyl acetate-ethylene copolymer, a vinyl acetate-vinyl chloride copolymer, polyester, polyimide, carboxymethylcellulose, polyethylene, polypropylene and polycarbonate. Preferable examples include a copolymer of methyl (meth)acrylate and (meth)acrylic acid, a copolymer of allyl (meth)acrylate and (meth)acrylic acid, and a multi-component copolymer of benzyl (meth)acrylate, (meth) acrylic acid and other monomers. These polymers may be used alone or in combination of two or more thereof. The content of the polymer with respect to the total solid content is generally 20% to 99% by mass, preferably 40% to 99% by mass, and more preferably 60% to 98% by mass.

(Method of Preparing Polarization Separation Layer)

The polarization separation layer including the cholesteric liquid crystal layer may be formed on the organic electroluminescent layer and a separately formed polarization separation layer or a laminate including the polarization separation layer may be laminated on the organic electroluminescent layer. Typically, it is preferable that a polarization separation layer is formed on a light emitting element substrate including an organic electroluminescent layer group, a circularly polarizing plate is further formed thereon, or a laminate of the polarization separation layer and a circularly polarizing plate is prepared, and then this laminate is provided on the light emitting element substrate including an organic electroluminescent layer group, and the latter is more preferable.

[Circularly Polarizing Plate]

The circularly polarizing plate is provided on the image display side of the organic electroluminescent layer in the organic EL image display device for reducing the reflected glare of external light and improving the contrast. As the circularly polarizing plate, a known circularly polarizing plate as the circularly polarizing plate used in an organic EL image display device can be used.

The circularly polarizing plate includes a phase difference layer and a polarization layer. The circularly polarizing plate may have other layers such as an adhesive layer and a surface protective layer. In the image display device according to the embodiment of the present invention, the polarization separation layer, the phase difference layer and the polarization layer are arranged in this order in the circularly polarizing plate. The circularly polarizing plate may be formed of a phase difference layer and a polarization layer. The phase difference layer is preferably formed of a ¼ wavelength plate and the polarization layer is preferably formed of a linear polarizing plate.

The linear polarizing plate transmits specific linear polarized light among the light passing therethrough, and absorbs linear polarized light orthogonal thereto. As the linear polarizing plate, for example, a plate obtained by absorbing iodine in polyvinyl alcohol, performing stretching, and applying a protective layer of triacetylcellulose on both sides of a film having a polarization function, or a plate obtained by adding metal nanorods of Ag or the like, to polyvinyl alcohol and performing stretching can be used.

The ¼ wavelength plate may be a phase difference layer having a function as a ¼ wavelength plate in the visible light region. Examples of the ¼ wavelength plate include a single layer ¼ wave plate, and a broadband ¼ wave plate in which a ¼ plate and a ½ wave phase difference plate are laminated, and these plates can be suitably used.

In the present specification, the phase difference means front retardation. The phase difference can be measured using a polarization phase difference analyzer AxoScan manufactured by AXOMETRICS.

The ¼ wavelength plate is not particularly limited and can be appropriately selected according to the purpose. Examples thereof include a quartz plate, a stretched polycarbonate film, a stretched norbornene polymer film, a transparent film in which inorganic particles exhibiting birefringence, such as strontium carbonate, are contained and aligned, a thin film formed by oblique deposition of an inorganic dielectric on a support, or a film formed by applying a liquid crystal composition to a support or an alignment film, after forming the polymerizable liquid crystal compound in the liquid crystal composition into a nematic alignment in the liquid crystal state, and immobilizing the liquid crystal compound by photocrosslinking or thermal crosslinking. A combination of a plurality of these may be used.

[Organic Electroluminescent Layer]

The organic electroluminescent layer means a layer that has at least a light emitting layer and may further include each layer such as a hole transport layer, an electron transport layer, a hole block layer, an electron block layer, a hole injection layer, and an electron injection layer as functional layers other than the light emitting layer.

The organic electroluminescent layer may be an organic electroluminescent layer of a microcavity structure described in JP2016-139372A.

[Light Emitting Element Substrate]

The light emitting element substrate includes at least a reflecting layer and an organic electroluminescent layer. Usually, a light emitting element substrate may include a reflecting layer and an organic electroluminescent layer on a TFT substrate having a pixel structure which is formed by a thin film transistor (TFT) on a surface of glass or the like. The organic electroluminescent layer is typically is preferably contained as the organic electroluminescent layer group arranged in the form of a matrix on the TFT substrate.

In the light emitting element substrate, when the TFT substrate, the reflecting layer and the organic electroluminescent layer are arranged in this order, the image display device is of a top emission type and can extracts light to display an image. In the light emitting element substrate, when the TFT substrate, the reflecting layer and the organic electroluminescent layer are arranged in this order, the image display device is of a bottom emission type and can extract light to display an image. The image display device according to the embodiment of the present invention may of a bottom emission type or a top emission type, and is preferably of a top emission type.

The reflecting layer may be an example reflective electrode. As the reflective electrode, an aluminum electrode that is generally used in an organic light emitting device can be used. The light emitting element substrate further includes a transparent electrode such as indium tin oxide (ITO) electrode. Examples of the layer structure of the light emitting element substrate include the following.

TFT substrate/reflective electrode/organic light emitting layer/transparent electrode TFT substrate/transparent electrode/organic light emitting layer/reflective electrode The light emitting element substrate may further include a barrier layer for sealing the organic electroluminescent layer, and a light extraction layer.

With respect to the organic electroluminescent layer, each layer in the organic electroluminescent layer, preparing materials and configurations of the transparent electrode and the reflective electrode, the lamination order, and the configuration of the light emitting element substrate, the descriptions in paragraphs 0081 to 0122 of JP2012-155177A, JP4011292B, and JP2016-139372A can be referred to.

[Adhesive Layer]

The image display device according to the embodiment of the present invention may include an adhesive layer for bonding the layers. As the adhesive used for forming the adhesive layer, from the viewpoint of the curing method, there are a hot melt type, a thermosetting type, a photocuring type, a reaction curing type, and a pressure sensitive adhesive type without curing. As respective materials, acrylate-based, urethane-based, urethaneacrylate-based, epoxy-based, epoxy acrylate-based, polyolefin-based, modified olefin-based, polypropylene-based, ethylenevinyl alcohol-based, vinyl chloride-based, chloroprene rubber-based, cyanoacrylate-based, polyamide-based, polyimide-based, polystyrene-based, and polyvinyl butyral-based compounds, or the like can be used. In the viewpoint of workability and productivity, a photocuring type is preferable as a curing type and an ultraviolet curing type is particularly preferable. In the viewpoint of optical transparency and heat resistance, acrylate-based, urethaneacrylate-based, epoxy acrylate-based compounds, or the like are preferably used as the material.

The adhesive layer may be a highly transparent adhesive transfer tape (OCA tape). Particularly, an OCA tape is preferably used for bonding the organic electroluminescent element substrate and a film (a laminate including a polarization separation layer) provided thereon. As the high transparency adhesive transfer tape, a commercially available product for an image display device, particularly, a commercially available product for the surface of an image display unit of an image display device may be used. Examples of commercially available products include pressure-sensitive adhesive sheets (PD-S1 and the like) manufactured by PANAC CO., LTD., and pressure-sensitive adhesive sheets of MHM series manufactured by NICHIEI KAKOH CO., LTD.

The thickness of the adhesive layer is preferably 0.1 μm to 10 μm, and more preferably 0.5 μm to 5.0 μm.

<Method of Preparing Organic EL Image Display Device>

The organic EL image display device can be prepared by providing a polarization separation layer on a light emitting element substrate, bonding a separately formed circularly polarizing plate to the polarization separation layer so that a phase difference layer of the circularly polarizing plate is in contact with the polarization separation layer or forming a polarization separation layer on the phase difference layer side of a circularly polarizing plate, and bonding the layer to the light emitting element substrate. When using a light emitting element substrate including an organic electroluminescent layer group in which organic electroluminescent layers are arranged in the form of a matrix on a reflecting layer, it is preferable to use a polarization separation layer in which the polarization separation site is arranged corresponding to the organic electroluminescent layer and which forms a matrix-like polarization separation region. The organic electroluminescent layer group and the polarization separation region may be laminated and bonded by aligning the organic electroluminescent layer group and the polarization separation region so that each organic electroluminescent layer and the polarization separation site correspond to each other.

When the organic electroluminescent layer group includes an organic electroluminescent layer that emits light of two or more wavelengths, a polarization separation layer in which polarization separation sites are arranged may be prepared and bonded such that each polarization separation site corresponding to each organic electroluminescent layer reflects the light of one polarization state in the wavelength range of light emitted from the organic electroluminescent layers arranged at each of the corresponding positions.

EXAMPLES

Hereinafter, the present invention is described in detail with reference to examples. Materials, reagents, material amounts, and ratios thereof, operations, or the like shown in the examples below can be appropriately changed without departing from the gist of the invention. Accordingly, the scope of the invention is not limited to the examples below.

In the examples, the reflection range indicated by a numerical value means a half-width obtained from the transmission spectrum of the cholesteric liquid crystal layer as described above and the light emission range indicated by a numerical value means a half-width of the light emission spectrum peak of the organic electroluminescent layer.

In the examples, SK-2057 (manufactured by Soken Chemical Co., Ltd.) was used as a pressure sensitive adhesive.

(Preparation of Alignment Film Composition A)

The mixture of each component shown below was stirred and dissolved in a container kept at 80° C. and an alignment film composition A was prepared.

| Alignment Film Composition A (parts by mass) | |
| --- | --- |
| Pure water | 97.2 |
| PVA-205 (manufactured by Kuraray Co.) | 2.8 |

(Preparation of Liquid Crystal Composition LC-1)

After each composition described below was mixed, the composition was filtered through a polypropylene filter having a pore size of 0.2 μm and the resultant was prepared as a liquid crystal composition LC-1.

| Liquid Crystal Composition LC-1 (parts by mass) | |
|---|---|
| Rod-like liquid crystal (L-1) | 19.57 |
| Horizontal alignment agent (L-2) | 0.015 |
| Chiral agent (C-1) | 1.49 |
| Radical polymerization initiator (Irgacure 907, manufactured by BASF) | 0.587 |
| Photosensitizer (KAYACURE DETX-S, manufactured by Nippon Kayaku Co., Ltd.) | 0.916 |
| Polymerization control agent (IRGANOX 1076, manufactured by BASF SE) | 0.078 |
| Methyl ethyl ketone | 80.0 |

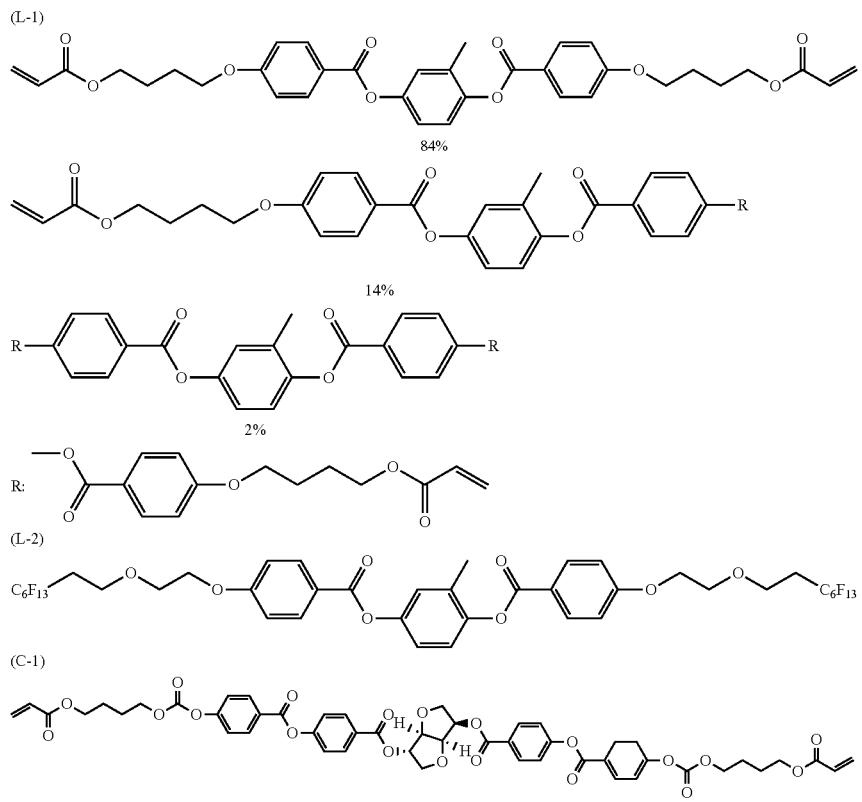

(Preparation of Liquid Crystal Composition LC-2)

LC-2 was prepared by using the same method and materials as the preparation of the liquid crystal composition LC-1 except that the amount of the chiral agent (C-1) to be added was changed to 1.22 parts by mass.

(Preparation of Liquid Crystal Composition LC-3)

LC-3 was prepared by using the same method and materials as the preparation of the liquid crystal composition LC-1 except that the amount of the chiral agent (C-1) to be added was changed to 1.04 parts by mass.

Example 1

Figure 3:
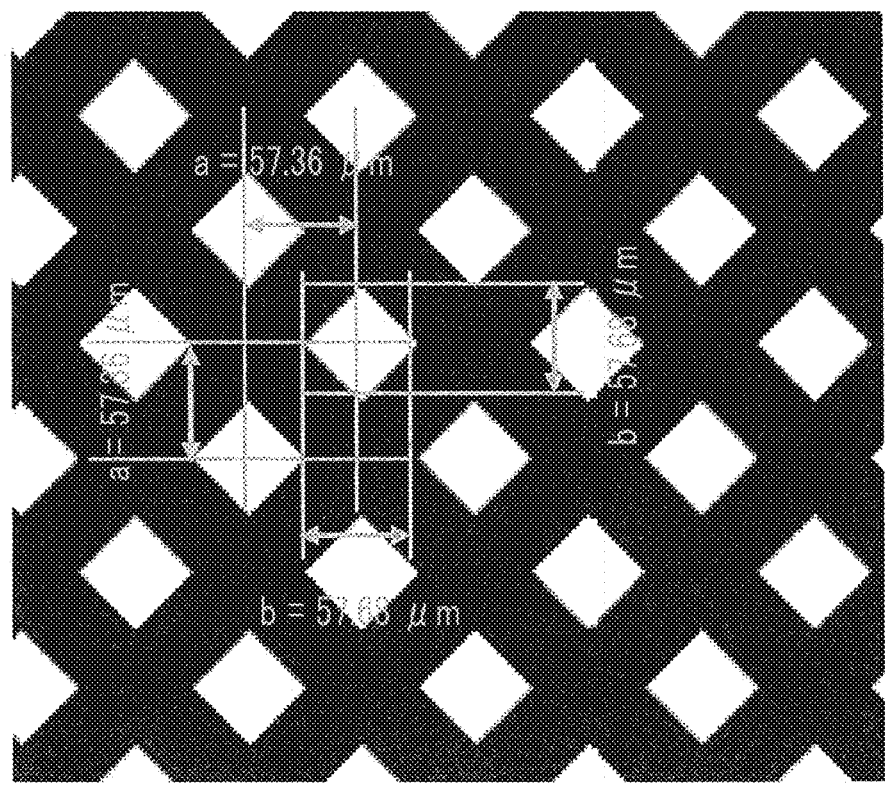
FIG. 3 is a view showing a transmission part (white) and a shielding part (black) of a photo mask A used in an example.

The alignment film composition A was uniformly applied to a glass substrate using a slit coater, and then dried for 2 minutes in an oven at 100° C. to obtain a glass substrate with an alignment film having a thickness of 0.5 μm. The alignment film was rubbed in a direction parallel to the coating direction. The liquid crystal composition LC-1 was applied to the rubbed surface. Next, the composition was heated and aged at a film surface temperature of 95° C. for 60 seconds, and immediately thereafter, the composition was exposed via a photo mask A shown in FIG. 3 (value of b: 57.7 μm: value of b corresponding to L of Expression (1)) at an exposure dose of 100 mJ/cm² using a PLA-501F exposure machine (super high pressure mercury lamp) manufactured by Canon Inc. under air at 25° C. In FIG. 3, white refers to a transmission part and black refers to a shielding part. Then, by exposing the entire substrate to light under nitrogen by an air-cooled metal halide lamp (manufactured by Eye Graphics, Inc.) at an exposure dose of 500 mJ/cm² while heating at 200° C., a layer having a cholesteric liquid crystal layer pattern divided into a region having selective reflection with a reflection center wavelength of 450 nm and a reflection range of 89 nm and an optically isotropic region was obtained.

A device in which the polarizing plate and the optical film were peeled off from the organic EL image display device SC-04E (manufactured by Samsung Electronics Co., Ltd.), and the surface of the barrier layer for protecting a light emitting element was exposed was used as a light emitting element substrate. The spectrum of the blue organic electroluminescent layer of the light emitting element substrate used had a center wavelength of 450 nm and a light emission range of 40 nm, the spectrum of the green organic electroluminescent layer had a central wavelength of 550 nm and a light emission range of 45 nm, and the spectrum of the red organic electroluminescent layer wad a central wavelength of 650 nm and a light emission range of 50 nm. A barrier layer surface of the light emitting element substrate and a layer having the cholesteric liquid crystal layer pattern obtained in the above way were laminated to correspond to each other by using the pressure sensitive adhesive such that a center of the blue organic electroluminescent layer shown in FIG. 4 and a center of the cholesteric liquid crystal layer were aligned. Thereafter, a circularly polarizing plate CP1 configured of a polarizer (polarizing layer), an optically anisotropic layer A (λ/2 plate), and an optically anisotropic layer B (λ/4 plate) was laminated on a glass substrate surface according to the order described in Example 1 of WO2016/194801 by using the pressure sensitive adhesive to prepare an image display device for evaluation. In the circularly polarizing plate CP1, the polarizer, the optically anisotropic layer A (λ/2 plate), and the optically anisotropic layer B (λ/4 plate) were arranged in this order, and when the circularly polarizing plate was observed from the polarizer side and the counterclockwise rotation was expressed as a positive value with respect to the transmission axis of the polarizer (0°), the angle of the slow axis of the λ/2 plate was −72.5° and the angle of the slow axis of the λ/4 plate was −12.5°. Moreover, lamination was performed so that the optically anisotropic layer B and the glass substrate may be in contact with each other.

A total thickness of the barrier layer of the light emitting element substrate and the pressure sensitive adhesive was 13 μm, and a distance between the blue organic electroluminescent layer and the cholesteric liquid crystal layer was 13 μm.

Example 2

A layer having the cholesteric liquid crystal layer pattern was prepared in the same manner as in Example 1 except that a photo mask B, in which the value of b in FIG. 3 was set to 30.00 μm, was used during pattern formation. Furthermore, a layer having the cholesteric liquid crystal layer pattern and a circularly polarizing plate CP1 are laminated in the same manner as in Example 1 on the barrier layer surface of the light emitting element substrate prepared in the same manner as in Example 1 to prepare the image display device for evaluation.

Example 3

A layer having the cholesteric liquid crystal layer pattern was prepared in the same manner as in Example 1 except that a photo mask C, in which the value of b in FIG. 3 was set to 20.00 μm, was used during pattern formation. Furthermore, a layer having the cholesteric liquid crystal layer pattern and a circularly polarizing plate CP1 were laminated in the same order as in Example 1 on the barrier layer surface of the light emitting element substrate prepared in the same manner as in Example 1 to prepare the image display device for evaluation.

Example 4

A layer having the cholesteric liquid crystal layer pattern was prepared in the same manner as in Example 1 except that a photo mask D, in which the value of b in FIG. 3 was set to 75.00 μm, was used during pattern formation. Furthermore, a layer having the cholesteric liquid crystal layer pattern and a circularly polarizing plate CP1 were laminated in the same order as in Example 1 on the barrier layer surface of the light emitting element substrate prepared in the same manner as in Example 1 to prepare the image display device for evaluation.

Comparative Example 1

A surface of the optically anisotropic layer B of the circularly polarizing plate CP1 which is the same as used in Example 1 was laminated in the same order as in Example 1 on the barrier layer surface of the light emitting element substrate prepared in the same manner as in Example 1 to prepare an image display device for evaluation which does not include the layer having the cholesteric liquid crystal layer pattern.

Comparative Example 2

The cholesteric liquid crystal layer was prepared in the same manner as in Example 1 except that the mask used during pattern formation was not used and was used as a cholesteric liquid crystal layer formed on the entire surface and having no optically isotropic area. Furthermore, the obtained cholesteric liquid crystal layer formed on the entire surface and the circularly polarizing plate CP1 were laminated in the same order as in Example 1 on the barrier layer surface of the light emitting element substrate prepared in the same manner as in Example 1 to prepare the image display device for evaluation.

Example 5

Figure 5:
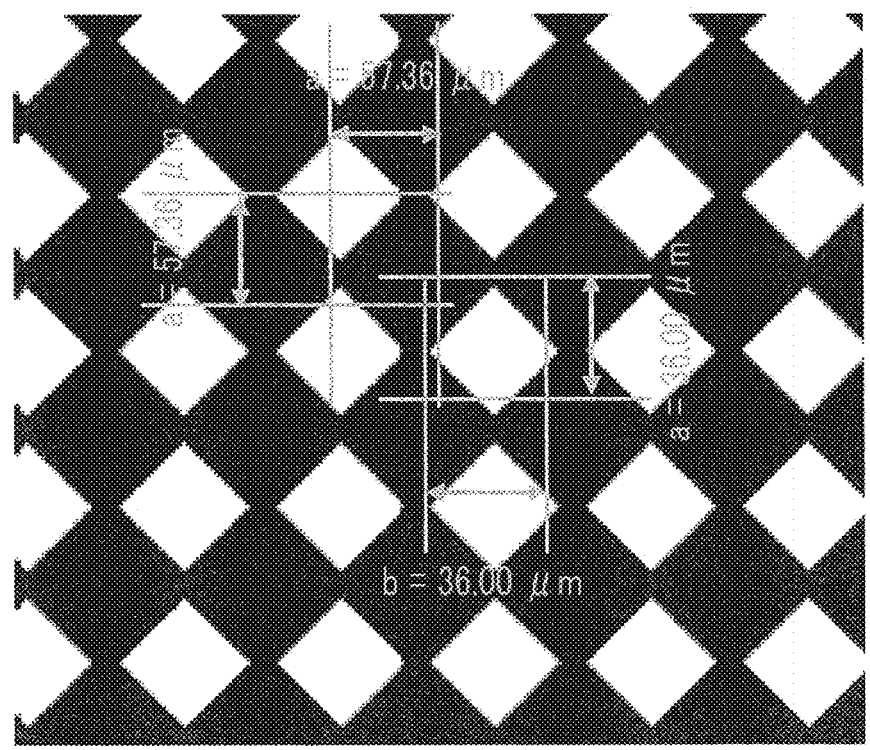
FIG. 5 is a view showing a transmission part (white) and a shielding part (black) of a photo mask E used in the example.

A layer having a cholesteric liquid crystal layer pattern divided into a region having selective reflection with a reflection center wavelength of 550 nm and the optically isotropic region was obtained in the same order as in Example 1 except that the liquid crystal composition LC-1 was changed to the liquid crystal composition LC-2 and a photo mask E shown in FIG. 5 was used.

Figure 4:
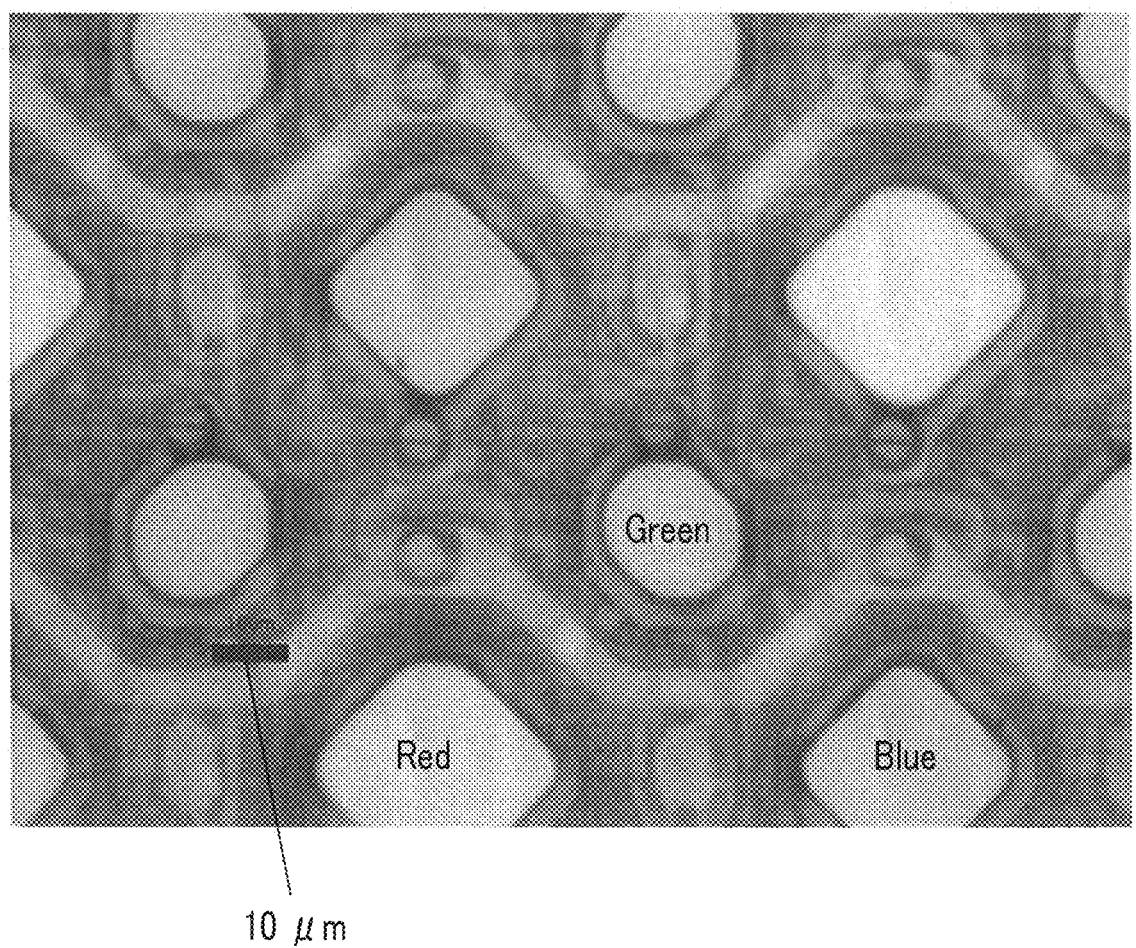
FIG. 4 is a view showing the arrangement of a blue organic electroluminescent layer (Blue), a green organic electroluminescent layer (Green), and a red organic electroluminescent layer (Red) in an SC-04E light emitting element substrate.

The barrier layer surface of the light emitting element substrate prepared in the same manner as in Example 1 and the layer having the cholesteric liquid crystal layer pattern obtained in the above way were laminated to correspond to each other by using the pressure sensitive adhesive such that a center of the green organic electroluminescent layer shown in FIG. 4 and a center of the cholesteric liquid crystal layer were aligned. Thereafter, the surface of the optically anisotropic layer B of the circularly polarizing plate CP1 was laminated on the glass substrate surface in the same order as in Example 1 by using the pressure sensitive adhesive to prepare the image display device for evaluation.

Example 6

A layer having a cholesteric liquid crystal layer pattern divided into a region having selective reflection with a reflection center wavelength of 650 nm and the optically isotropic region was obtained in the same order as in Example 1 except that the liquid crystal composition LC-1 was changed to the liquid crystal composition LC-3.

The barrier layer surface of the light emitting element substrate prepared in the same manner as in Example 1 and the layer having the cholesteric liquid crystal layer pattern obtained in the above way were laminated to correspond to each other by using the pressure sensitive adhesive such that a center of the red organic electroluminescent layer shown in FIG. 4 and a center of the cholesteric liquid crystal layer were aligned. Thereafter, the surface of the optically anisotropic layer B of the circularly polarizing plate CP1 was laminated on the glass substrate surface to prepare the image display device for evaluation.

Example 7

The liquid crystal composition LC-1 was applied to the rubbed surface of the rubbed alignment film prepared in the same order as in Example 1. Next, the composition was heated and aged at a film surface temperature of 95° C. for 60 seconds, and immediately thereafter, the composition was exposed via a photo mask A at an exposure dose of 100 mJ/cm$^2$ using a PLA-501F exposure machine (super high pressure mercury lamp) manufactured by Canon Inc. under air at 25° C. Thereafter, by washing away the unexposed and applied layer with methyl ethyl ketone, a layer having a cholesteric liquid crystal layer pattern divided into a region having selective reflection with a reflection center wavelength of 450 nm and a reflection range of 89 nm and a region having no layer obtained by curing the liquid crystal composition was obtained.

The barrier layer surface of the light emitting element substrate prepared in the same manner as in Example 1 and the layer having the cholesteric liquid crystal layer pattern obtained in the above way were laminated to correspond to each other by using the pressure sensitive adhesive such that a center of the blue organic electroluminescent layer shown in FIG. 4 and a center of the cholesteric liquid crystal layer were aligned. Thereafter, the surface of the optically anisotropic layer B of the circularly polarizing plate CP1 was laminated on the glass substrate surface by using the pressure sensitive adhesive to prepare the image display device for evaluation.

The total thickness of the barrier layer of the light emitting element substrate and the pressure sensitive adhesive was 13 μm, and a distance between the organic electroluminescent layer and the cholesteric liquid crystal layer was 13 μm.

Comparative Example 3

The cholesteric liquid crystal layer formed on the entire surface was obtained in the same order as in Comparative Example 2. Subsequently, a photosensitive resin composition containing silver particles having an average particle diameter of 200 nm was prepared by a method of Example 1 disclosed in JP4220796B, and an applied layer having a dry thickness of 0.5 μm was formed on the surface of the cholesteric liquid crystal layer formed on the entire surface by a spin coat method. Then, a photosensitive shading layer was exposed via a photo mask F, in which the transmission part and the shielding part shown in FIG. 3 was reversed, at an exposure dose of 500 mJ/cm$^2$ by using the ultrahigh pressure mercury lamp. Thereafter, water washing treatment (development treatment) was performed to remove the unexposed region, and a black matrix was prepared on the cholesteric liquid crystal layer.

The barrier layer surface of the light emitting element substrate prepared in the same manner as in Example 1 and the cholesteric liquid crystal layer obtained in the above way were laminated to correspond to each other by using the pressure sensitive adhesive such that a center of the blue organic electroluminescent layer shown in FIG. 4 and a center of the cholesteric region were aligned. Thereafter, the surface of the optically anisotropic layer B of the circularly polarizing plate CP1 was laminated on the glass substrate surface by using the pressure sensitive adhesive to prepare the image display device for evaluation.

Example 8

A triacetyl cellulose film having a thickness of 40 μm "Z-TAC" (manufactured by Fujifilm Corporation), which is commercially available, was used as a support. After passing Z-TAC through a dielectric heating roll at a temperature of 60° C. and raising the film surface temperature to 40° C., an alkaline solution having composition as follows was applied to one side of the film using a bar coater with an application amount of 14 ml/m$^2$ and heated at 110° C., and transferred for ten seconds under a steam type far infrared heater manufactured by Noritake Co., Limited. Next, 3 ml/m$^2$ of pure water was applied by using the same bar coater. Next, water washing with a fountain coater and water drainage with an air knife were repeated three times, and thereafter the film was transported to a drying zone at 70° C. for ten seconds and dried to prepare an acetylcellulose transparent support on which an alkaline saponification treatment was performed.

| Composition of Alkaline Solution (Parts by mass) | |
| --- | --- |
| Potassium hydroxide | 4.7 |
| Water | 15.8 |
| Isopropanol | 63.7 |
| Surfactant SF-1: $C_{14}H_{29}O(CH_2CH_2O)_{20}H$ | 1.0 |
| Propylene glycol | 14.8 |

After the alignment film composition A was uniformly applied on the saponified triacetyl cellulose film having the thickness of 40 μm by using the bar coater, the alignment film composition A was dried in an oven at 100° C. for two minutes. As a result, a support with the alignment film having the thickness of 0.5 μm was obtained. The alignment film was rubbed in a direction parallel to the coating direction. The liquid crystal composition LC-1 was applied to the rubbed surface. Next, the composition was heated and aged at a film surface temperature of 95° C. for 60 seconds, and immediately thereafter, the composition was exposed via a photo mask A at an exposure dose of 100 mJ/cm$^2$ using a PLA-501F exposure machine (super high pressure mercury lamp) manufactured by Canon Inc. under air at 25° C. Then, by exposing the entire substrate to light under nitrogen by an air-cooled metal halide lamp (manufactured by Eye Graphics, Inc.) at an exposure dose of 500 mJ/cm$^2$ while heating at 150° C., a layer having a cholesteric liquid crystal layer pattern divided into a region having selective reflection with a reflection center wavelength of 450 nm and a reflection range of 89 nm and an optically isotropic region was obtained. The barrier layer surface of the light emitting element substrate prepared in the same manner as in Example 1 and the triacetyl cellulose film surface were laminated to correspond to each other by using the pressure sensitive adhesive such that a center of the blue organic electroluminescent layer shown in FIG. 4 and a center of the cholesteric liquid crystal layer were aligned. Thereafter, the surface of the optically anisotropic layer B of the circularly polarizing plate CP1 was laminated on a layer surface having a cholesteric liquid crystal layer pattern to prepare an image display for evaluation.

The total of the thickness of the barrier layer of the light emitting element substrate, the pressure sensitive adhesive, and a the TAC film was 53 μm, and a distance between the organic electroluminescent layer and the cholesteric liquid crystal layer was 53 μm.

Example 9

In the mask used during pattern formation, a layer having the cholesteric liquid crystal layer pattern was prepared in the same order as in Example 8 except that the value of b in FIG. 3 was set to 95 μm, and then the layer having the cholesteric liquid crystal layer pattern and the circularly polarizing plate CP1 were laminated in the same order as in Example 8 on the barrier layer surface of the light emitting element substrate prepared in the same manner as in Example 1 to prepare the image display for evaluation.

Figure 6:
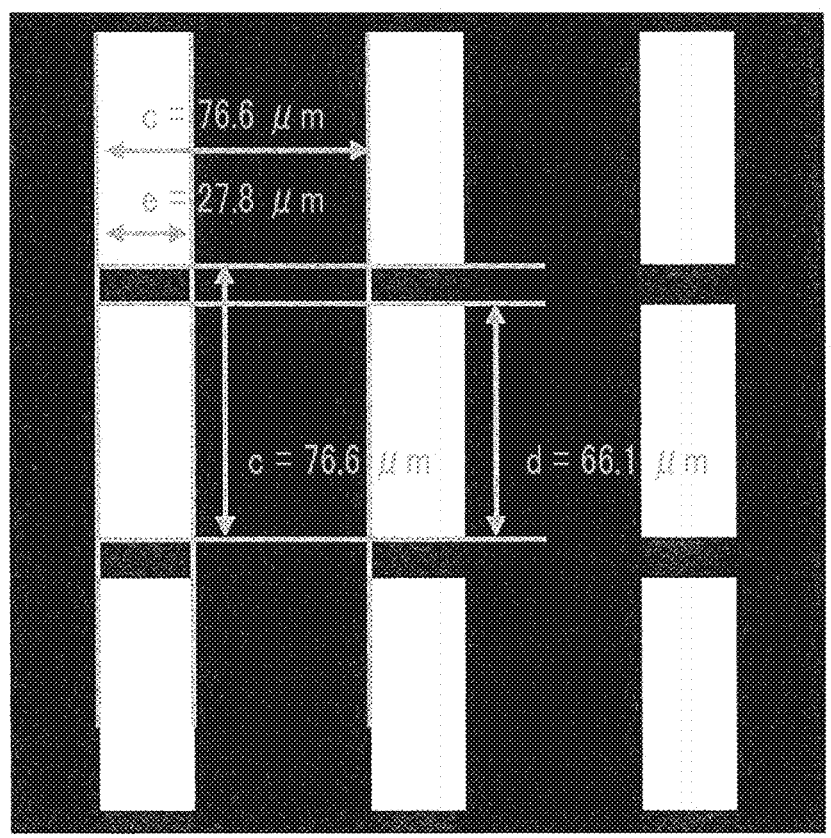
FIG. 6 is a view showing a transmission part (white) and a shielding part (black) of a photo mask G used in the example.

Example 10 a layer having a cholesteric liquid crystal layer pattern divided into a region having selective reflection with a reflection center wavelength of 450 nm and a reflection range of 89 nm and an optically isotropic region was obtained in the same order as in Example 1 except that a photo mask G shown in FIG. 6 was used during pattern formation. In FIG. 6, white refers to the transmission part and black refers to the shielding part.

Figure 7:
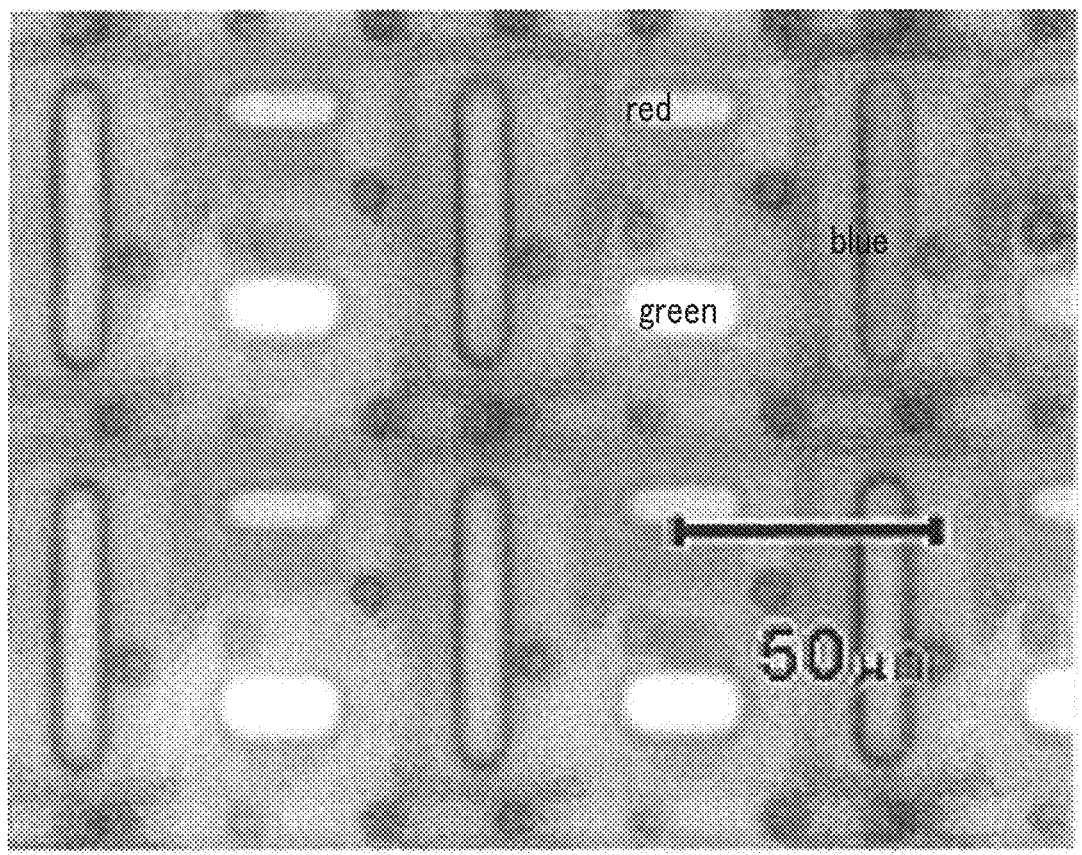
FIG. 7 is a view showing the arrangement of a blue organic electroluminescent layer (Blue), a green organic electroluminescent layer (Green), and a red organic electroluminescent layer (Red) in a light emitting element substrate of Apple Watch.

The polarizing plate and the optical film were peeled off from Apple Watch (manufactured by Apple Inc.) to expose the surface of the barrier layer that protects the organic electroluminescent layer, thereby forming a light emitting element substrate. The layer having the cholesteric liquid crystal layer pattern obtained in the above way was laminated on the barrier layer surface of the light emitting element substrate corresponding to each other by using the pressure sensitive adhesive such that a center of the blue organic electroluminescent layer shown in FIG. 7 and a center of the cholesteric liquid crystal layer were aligned. Thereafter, the surface of the optically anisotropic layer B of the circularly polarizing plate CP1 was laminated on the glass substrate surface by using the pressure sensitive adhesive to prepare the image display device for evaluation.

The total thickness of the barrier layer of the light emitting element substrate and the pressure sensitive adhesive was 15 μm, and a distance between the organic electroluminescent layer and the cholesteric liquid crystal layer was 15 μm.

Comparative Example 4

The surface of the optically anisotropic layer B of the circularly polarizing plate CP1 was laminated on the barrier layer surface of the light emitting element substrate prepared in the same manner as in Example 10 to prepare an image display device for evaluation which does not have the cholesteric liquid crystal layer pattern.

Comparative Example 5

A cholesteric liquid crystal layer formed on the entire surface having no optically isotropic area was prepared in the same manner as in Comparative Example 2 without the mask used during pattern formation. Furthermore, the obtained cholesteric liquid crystal layer formed on the entire surface and the circularly polarizing plate CP1 were laminated in the same order as in Example 10 on the barrier layer surface of the light emitting element substrate prepared in the same manner as in Example 10 to prepare the image display device for evaluation.

(Preparation of Liquid Crystal Composition LC-4)

After each composition described below was mixed, the composition was filtered through a polypropylene filter having a pore size of 0.2 μm and the resultant was prepared as a liquid crystal composition LC-4.

| Liquid Crystal Composition LC-4 (parts by mass) | |
|---|---|
| Rod-like liquid crystal (LC-1) | 100 |
| Photoreactive right-turning chiral agent (C-2) | 6.00 |
| Horizontal alignment agent (LC-2) | 0.1 |
| Radical polymerization initiator (IRGACURE 819, manufactured by BASF) | 4 |
| Polymerization inhibitor (IRGANOX 1010, manufactured by BASF SE) | 1 |
| Solvent (chloroform) | 330.3 |

(C-2)

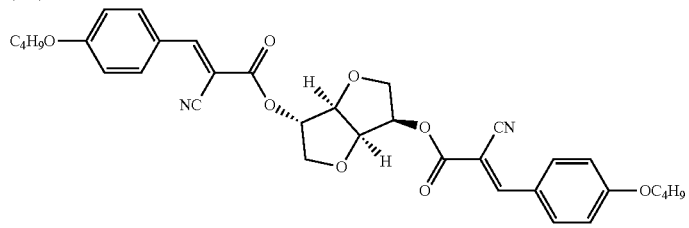

Photoreactive right-turning chiral agent

Example 11

A coating liquid LC-4 was spin-coated on the rubbed alignment film prepared in the same order as in Example 1 to form a coating film having a thickness of 5 μm. The glass substrate with the alignment film on which the coating film was disposed was heated on a hot plate at 80° C. for one minute to dry and remove the solvent and to form a cholesteric alignment state. Thereafter using EXECURE 3000-W manufactured by HOYA CORPORATION, the glass substrate was irradiated with ultraviolet (UV) light having an illuminance of 30 mW/cm$^2$ for ten seconds via a photo mask F in a nitrogen atmosphere at room temperature, and an alignment of exposed part (A) is immobilized. Next, the photo mask was removed, and irradiation with UV light having an illuminance of 3 mW/cm$^2$ was performed for eight seconds in air. Thereafter, by the glass substrate being heated on the hot plate at 80° C. for one minute, the reflection wavelength in a part where the alignment was not immobilized was converted into the long wavelength side, and the irradiation with UV light having an illuminance of 30 mW/cm$^2$ for ten seconds was performed again in the nitrogen atmosphere at room temperature, thereby an alignment of residual part (B) being immobilized. As a result, a layer having the cholesteric liquid crystal layer pattern is prepared. The reflection center wavelength in the part A was 350 nm, and the reflection center wavelength in the part B was 450 nm.

The barrier layer of the light emitting element substrate prepared in the same manner as in Example 1 and the layer having the cholesteric liquid crystal layer pattern obtained the above way were laminated to correspond to each other by using the pressure sensitive adhesive such that a center of the blue organic electroluminescent layer shown in FIG. 4 and a center of the region (B) were aligned. Thereafter, the surface of the optically anisotropic layer B of the circularly polarizing plate CP1 was laminated on the glass substrate surface by using the pressure sensitive adhesive to prepare the image display device for evaluation.

The total thickness of the barrier layer of the light emitting element substrate and the pressure sensitive adhesive was 13 μm, and the distance between the organic electroluminescent layer and the layer having the cholesteric liquid crystal layer pattern was 13 μm.

Example 12

Figure 8:
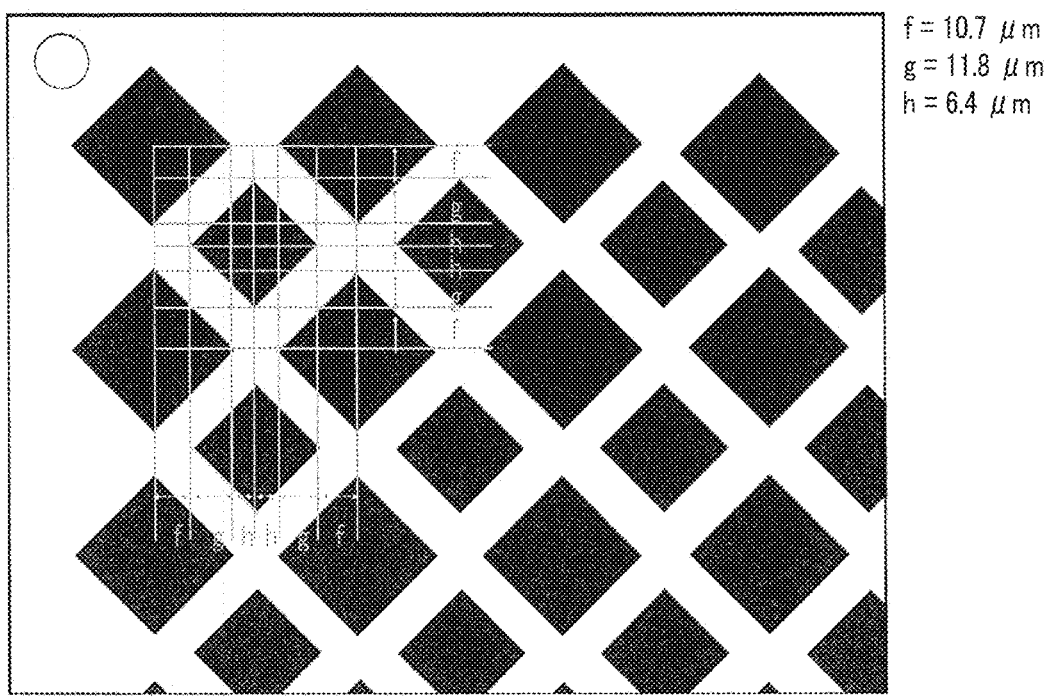
FIG. 8 is a view showing a transmission part (white) and a shielding part (black) of a photo mask H used in the example, and an enlarged view of a part thereof.
Figure 8:
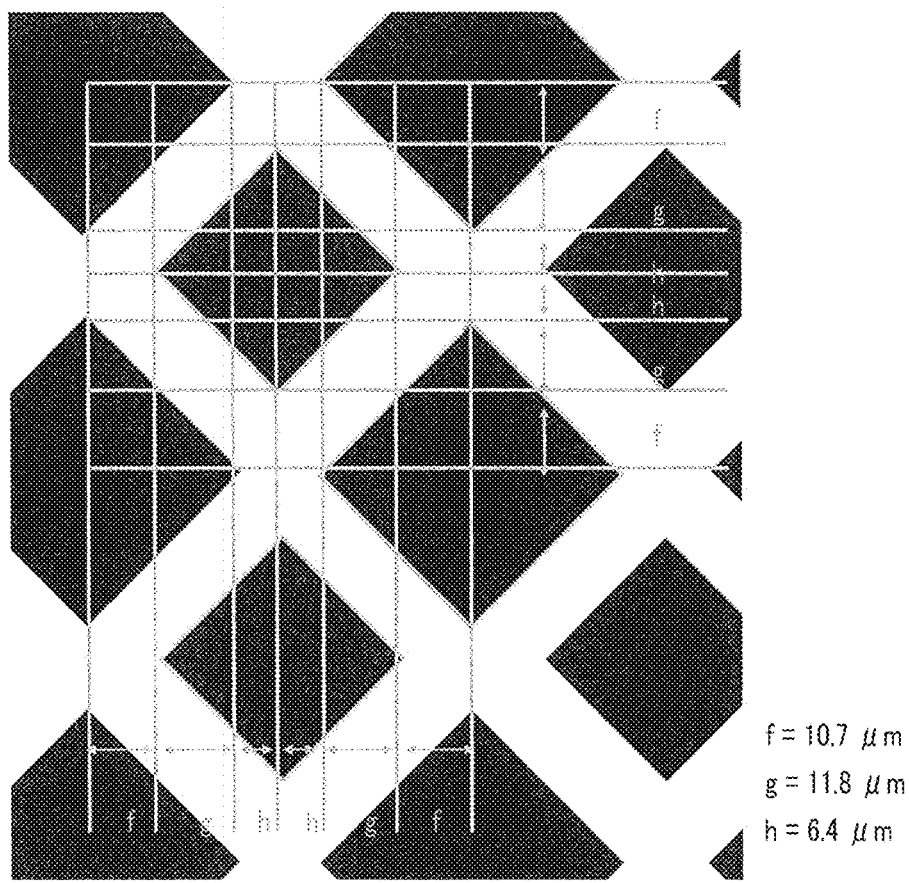
Figure 9:
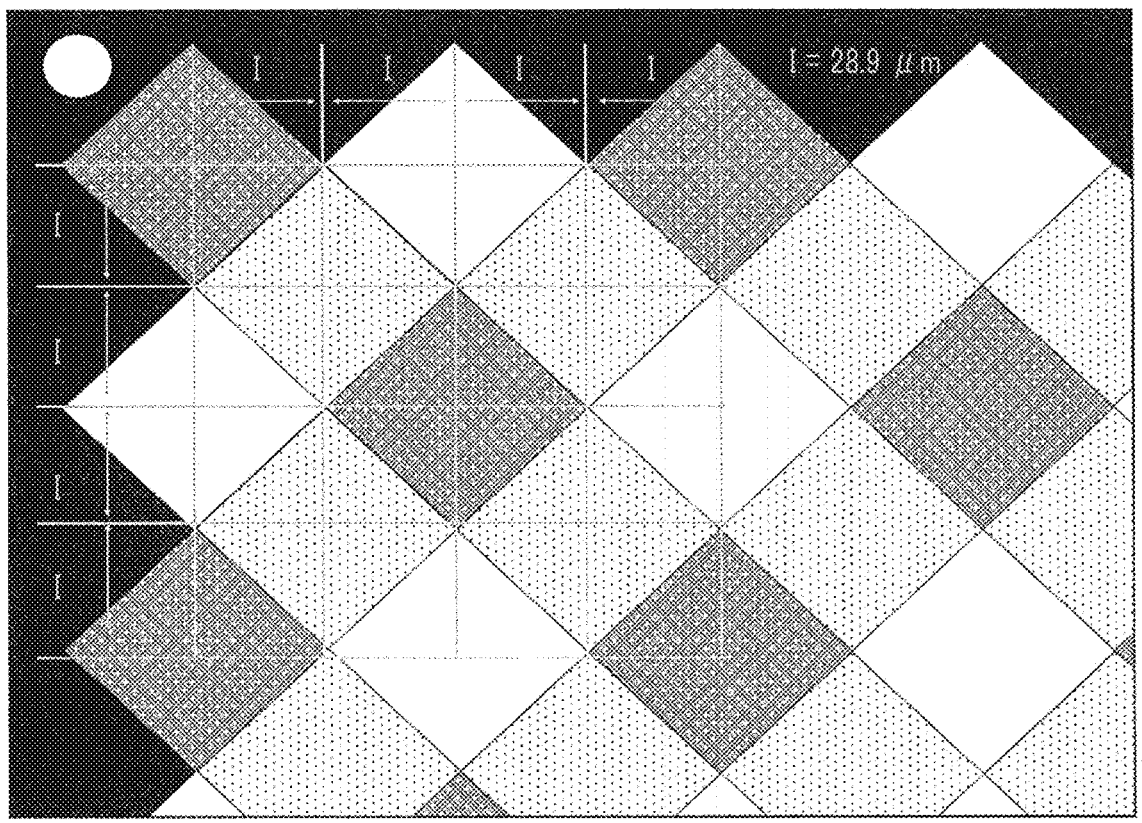
FIG. 9 is a view showing a transmission part (white), a shielding part (black), and a halftone portion of a halftone photo mask I used in the example.
Figure 10:
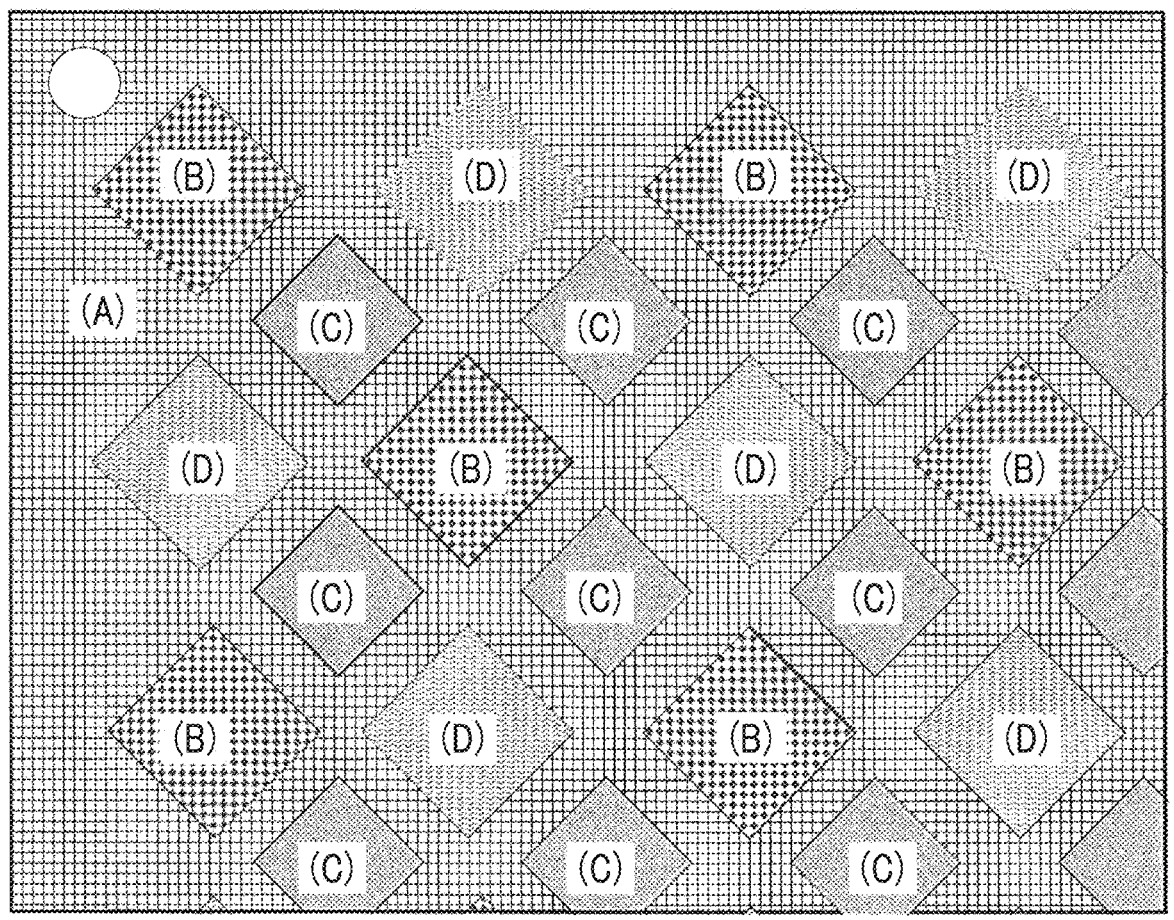
FIG. 10 is a view showing parts A to D corresponding to the photo mask H of FIG. 8.

A coating liquid LC-4 was spin-coated on the rubbed alignment film prepared in the same order as in Example 1 to form a coating film having a thickness of 5 μm. The glass substrate with the alignment film on which the coating film was disposed was heated on a hot plate at 80° C. for one minute to dry and remove the solvent and to form a cholesteric alignment state. Thereafter using EXECURE 3000-W manufactured by HOYA CORPORATION, the glass substrate was irradiated with ultraviolet (UV) light having an illuminance of 30 mW/cm$^2$ for ten seconds via a photo mask H shown in FIG. 8 in a nitrogen atmosphere at room temperature, and an alignment of exposed part ((A) shown in FIG. 10) is immobilized. Next, the photo mask H was removed, and a halftone photo mask I shown in FIG. 9 was placed at the same position so that the photo mask H and the marking portion overlap. The halftone photo mask I has a light transmittance of 67% and a light transmittance of 33% as a halftone portion. The glass substrate was irradiated with UV light having the illuminance of 3 mW/cm$^2$ in air via the halftone photo mask I for 25 seconds, and then heated on the hot plate at 80° C. for one minute. Thereby, the reflection wavelength in a part where the alignment was not immobilized was converted into the long wavelength side, and thereafter the irradiation with UV light having the illuminance of 30 mW/cm$^2$ for ten seconds was performed again in the nitrogen atmosphere at room temperature, so that regions (B) to (D) shown in FIG. 10 were immobilized. As a result, a layer having the cholesteric liquid crystal layer pattern is prepared. The reflection center wavelength in the part A was 350 nm, the reflection center wavelength in the part B was 450 nm, the reflection center wavelength in the part C was 550 nm, and the reflection center wavelength in the part D was 650 nm.

The barrier layer of the light emitting element substrate prepared in the same manner as in Example 1 and the layer having the cholesteric liquid crystal layer pattern obtained the above way were laminated to correspond to each other by using the pressure sensitive adhesive such that a center of the blue organic electroluminescent layer shown in FIG. 4 and a center of the region (B) were aligned. Thereafter, the surface of the optically anisotropic layer B of the circularly polarizing plate CP1 was laminated on the glass substrate surface by using the pressure sensitive adhesive to prepare the image display device for evaluation.

The following evaluations were performed on the above Examples and Comparative Examples, and the evaluation results are collectively shown in Table 1 below. In addition, the values of L, M, and N can be defined for all directions at all points in the plane, and therefore the representative values (the values with respect to the points and directions which hardly satisfy Expressions (1) and (2)) are shown in the table. In Example 10, evaluation was performed on both a long axis and a short axis.

(Evaluation for Light Emitting Brightness and Blurring of Image Display Device)

The image display device for evaluation was turned on, allowed to display a single color (respective colors of the organic electroluminescent layer in Table 1, but only white in Example 12) on the entire surface, and then installed on a pedestal, and a spectroradiometer SR-3 (manufactured by Topcon Corporation) was disposed two meters ahead of the pedestal to perform brightness evaluation. The brightness evaluation was performed by evaluating an improvement rate of the brightness on the basis of the following criteria with respect to brightness of the image display device which does not have corresponding cholesteric materials. That is, in Examples 1 to 4, Examples 7 to 9, Example 11, and Comparative Examples 2 and 3, the brightness improvement rates with respect to the brightness of Comparative Example 1 were determined; in Examples 5, 6, and 12, the brightness improvement rates with respect to the brightness of the image display device of Comparative Example 1, which was used to display only green color on the entire surface, only red color on the entire surface, and only white color on the entire surface respectively, were determined; and in Example 10 and Comparative Example 5, the brightness improvement rates with respect to the brightness of Comparative Example 4 were determined.

A: Brightness improvement rate is 40% or more

B: Brightness improvement rate is less than 40% and 20% or more

C: Brightness improvement rate is less than 20% and 5% or more

D: Brightness improvement rate is less than 5%

Subsequently, in each of Examples and Comparative examples, the color (blue, green, and red) of the organic electroluminescent layer was repeated for 2 pixels and black was repeated for 5 pixels to display stripes of each of the color and black, and thereafter presence or absence of blurring was evaluated with the naked eye. However, in Example 12 only, blue or green and red were repeated for 2 pixels and black was repeated for 5 pixels to display stripes of blue or green and red, and thereafter presence or absence of blurring was respectively evaluated with the naked eye.

A: There was no blurring

B: Blurring was visible in a case of being enlarged by using a loupe, but the blurring was invisible to the naked eye, and there was no problem in practical use D: Blurring was visible to the naked eye

TABLE 1

| | Light emitting element substrate | Color of organic electroluminescent layer | Length of organic electroluminescent layer M (μm) | Distance of organic electroluminescent layer adjacent to each other N (μm) | Distance between organic electroluminescent layer and polarization separation site D (μm) |
|---|---|---|---|---|---|
| Example 1 | SC-04E | B | 20.2 | 81.6 | 13 |
| Example 2 | SC-04E | B | 20.2 | 81.6 | 13 |
| Example 3 | SC-04E | B | 20.2 | 81.6 | 13 |
| Example 4 | SC-04E | B | 20.2 | 81.6 | 13 |
| Comparative Example 1 | SC-04E | B | 20.2 | 81.6 | 13 |
| Comparative Example 2 | SC-04E | B | 20.2 | 81.6 | 13 |
| Example 5 | SC-04E | G | 14.4 | 40.8 | 13 |
| Example 6 | SC-04E | R | 20.2 | 81.6 | 13 |
| Example 7 | SC-04E | B | 20.2 | 81.6 | 13 |
| Comparative Example 3 | SC-04E | B | 20.2 | 81.6 | 13 |
| Example 8 | SC-04E | B | 20.2 | 81.6 | 53 |
| Example 9 | SC-04E | B | 20.2 | 81.6 | 53 |
| Example 10 | apple watch | B | 55.6 9 | 76.6 76.6 | 15 15 |
| Comparative Example 4 | apple watch | B | 55.6 | 76.6 | 15 |
| Comparative Example 5 | apple watch | B | 55.6 | 76.6 | 15 |
| Example 11 | SC-04E | B | 20.2 | 81.6 | 13 |
| Example 12 | SC-04E | B | 20.2 | 81.6 | 13 |
| | SC-04E | G | 14.4 | 40.8 | 13 |
| | SC-04E | R | 20.2 | 81.6 | 13 |

| | | Length of polarization separation site L (μm) | Visible light transmission region | (M + N)/2 | M + 1.25 × D | Brightness | Blurring |
|---|---|---|---|---|---|---|---|
| | Example 1 | 40.6 | Iso | 50.9 | 36.4 | A | A |
| | Example 2 | 21.2 | Iso | 50.9 | 36.4 | B | A |
| | Example 3 | 14.1 | Iso | 50.9 | 36.4 | C | A |
| | Example 4 | 53.0 | Iso | 50.9 | 36.4 | A | B |
| | Comparative Example 1 | 0 (None) | Iso | 50.9 | 36.4 | D | A |
| | Comparative Example 2 | Solid | Iso | 50.9 | 36.4 | A | C |
| | Example 5 | 25.5 | Iso | 27.6 | 30.7 | B | A |
| | Example 6 | 40.6 | Iso | 50.9 | 36.4 | A | A |
| | Example 7 | 40.6 | (Etching) | 50.9 | 36.4 | A | A |
| | Comparative Example 3 | 40.6 | Black matrix | 50.9 | 36.4 | D | A |
| | Example 8 | 40.6 | Iso | 50.9 | 86.4 | C | A |
| | Example 9 | 67.2 | Iso | 50.9 | 86.4 | B | B |
| | Example 10 | 66.1 27.8 | Iso Iso | 66.1 42.8 | 74.4 27.8 | B | A |
| | Comparative Example 4 | None | Iso | 66.1 | 74.4 | D | A |
| | Comparative Example 5 | Solid | Iso | 66.1 | 74.4 | A | C |
| | Example 11 | 40.6 | UV Ch | 50.9 | 36.4 | A | A |
| | Example 12 | 40.6 25.5 40.6 | UV Ch | 50.9 27.6 50.9 | 36.4 30.7 36.4 | A | A |

B = Blue
G = Green
R = Red
ISO: Optically isotropic
UV Ch: Having selective reflection in ultraviolet light region As expected from Comparative Examples 1 and 2, in Comparative Example 2, the brightness was improved by inserting the cholesteric liquid crystal layer. However, since the cholesteric liquid crystal layer formed on the entire surface and having no optically isotropic area was used, the blurring occurred. It was speculated that light with a small polar angle emitted from the organic electroluminescent layer repeats the depolarization and the multiple reflection between the cholesteric liquid crystal layer and the reflecting layer, thereby the light spreading more widely than the element size and being recognized as blurring.

According to Examples 1 to 4, it was recognized that the multiple reflection is suppressed by having the polarization separation layer having the polarization separation region divided by the visible light transmission region and decreasing the length L of the polarization separation layer, thereby the blurring being reduced. In particular, in a case of Example 1 satisfying Expressions (1) and (2), the evaluations of the brightness improvement rate and the blurring were both A.

In Comparative Example 3, since light having the small polar angle was absorbed by the black matrix, the blurring was suppressed. On the other hand, it was recognized that since the brightness was decreased due to the absorption of the black matrix, a sufficient brightness improvement effect was not obtained, and compatibility between the brightness improvement and the suppressed blurring cannot be achieved as in a case of having the visible light transmission region.

In addition, upon a comparison of Examples 1, 8, and 9, it was recognized that the polarization separation layer is preferably disposed on the position adjacent to the organic electroluminescent layer as in Example 1 in view of compatibility between the brightness and the blurring.

EXPLANATION OF REFERENCES

1: polarization separation site
2: organic electroluminescent layer
3: reflecting layer
4: light emitting element substrate
5: phase difference layer
6: polarization layer
7: circularly polarizing plate
8: optically isotropic visible light transmission region
9: visible light transmission region having central wavelength of selective reflection in ultraviolet light wavelength range
10: adhesive layer
11: barrier layer

What is claimed is:

1. An organic EL image display device comprising:
a light emitting element substrate; and
a circularly polarizing plate,
wherein the light emitting element substrate includes a reflecting layer and an organic electroluminescent layer group arranged in a matrix form on the reflecting layer,
the reflecting layer, the organic electroluminescent layer group, and the circularly polarizing plate are arranged in sequential order,
a polarization separation layer is provided between the organic electroluminescent layer group and the circularly polarizing plate,
the polarization separation layer includes polarization separation sites arranged in a matrix form corresponding to the organic electroluminescent layer group,
a polarization separation site of the polarization separation sites reflects light of one polarization state and transmits light of the other polarization state in light emitted from the corresponding organic electroluminescent layer,
the polarization separation layer is divided by a visible light transmission region to form the polarization separation sites, and
in an optional plane Z which passes through the polarization separation site at optional coordinates xy of the matrix and is perpendicular to the reflecting layer, Expression (1) is satisfied:

$$L \leq (M+N)/2 \quad (1),$$

L: Length of intersection between the polarization separation site at coordinates xy and plane Z (μm), M: Length of intersection between the organic electroluminescent layer at coordinates xy corresponding to the polarization separation site at coordinates xy and plane Z (μm), N: Distance from center of intersection between the organic electroluminescent layer at coordinates xy and plane Z to center of intersection between closest organic electroluminescent layer emitting light of same wavelength as organic electroluminescent layer at coordinates xy and has intersection point at plane Z and plane Z (μm).

2. The organic EL image display device according to claim 1, wherein the polarization separation site includes a layer formed by immobilizing a cholesteric liquid crystalline phase.

3. The organic EL image display device according to claim 2,
wherein the visible light transmission region includes a layer obtained by curing the same composition as a composition for the polarization separation site, and
the visible light transmission region is optically isotropic.

4. The organic EL image display device according to claim 2,
wherein the visible light transmission region includes a layer obtained by curing the same composition as a composition for the polarization separation site, and
the visible light transmission region has a central wavelength of selective reflection in an ultraviolet light wavelength region or an infrared light wavelength region.

5. The organic EL image display device according to a claim 4, wherein in the polarization separation site at optional coordinates xy in the matrix, Expression (2) is satisfied:

$$L \geq 1.25 \times D + M \quad (2),$$

D: Distance between the polarization separation site at coordinates xy and the organic electroluminescent layer at coordinates xy (μm).

6. The organic EL image display device according to claim 2,
wherein the visible light transmission region does not include a layer obtained by curing the same composition as a composition for the polarization separation site.

7. The organic EL image display device according to a claim 1, wherein in the polarization separation site at optional coordinates xy in the matrix, Expression (2) is satisfied:

$$L \geq 1.25 \times D + M \quad (2),$$

D: Distance between the polarization separation site at coordinates xy and the organic electroluminescent layer at coordinates xy (μm).

8. An organic EL image display device comprising:
a light emitting element substrate; and
a circularly polarizing plate,
wherein the light emitting element substrate includes a reflecting layer and an organic electroluminescent layer group arranged in a matrix form on the reflecting layer,
the reflecting layer, the organic electroluminescent layer group, and the circularly polarizing plate are arranged in sequential order,
a polarization separation layer is provided between the organic electroluminescent layer group and the circularly polarizing plate, the polarization separation layer includes polarization separation sites arranged in a matrix form corresponding to the organic electroluminescent layer group, a polarization separation site of the polarization separation sites reflects light of one polarization state and transmits light of the other polarization state in light emitted from the corresponding organic electroluminescent layer, the polarization separation layer is divided by a visible light transmission region to form the polarization separation sites, the polarization separation site includes a layer formed by immobilizing a cholesteric liquid crystalline phase, the visible light transmission region includes a layer obtained by curing the same composition as a composition for the polarization separation site, and the visible light transmission region has a central wavelength of selective reflection in an ultraviolet light wavelength region or an infrared light wavelength region.

* * * * *